United States Patent
Tominaga et al.

[11] Patent Number: 5,668,432
[45] Date of Patent: Sep. 16, 1997

[54] ARTICULATION DEVICE

[75] Inventors: Takayuki Tominaga, Kariya; Kouji Senda, Oobu; Takaharu Idogaki, Okazaki; Takashi Kaneko; Hitoshi Kanayama, both of Nagoya, all of Japan

[73] Assignee: Nippondenso Co., Ltd., Kariya, Japan

[21] Appl. No.: 620,210

[22] Filed: Mar. 22, 1996

[30] Foreign Application Priority Data

Mar. 24, 1995 [JP] Japan .................. 7-091584
May 19, 1995 [JP] Japan .................. 7-121365

[51] Int. Cl.$^6$ .................................... H01L 41/08
[52] U.S. Cl. .......... 310/328; 310/317; 310/323; 310/330; 310/331; 310/366; 901/18; 901/41
[58] Field of Search ............... 310/323, 328, 310/330–332, 366, 316, 317; 901/14–18, 30, 41

[56] References Cited

U.S. PATENT DOCUMENTS

| 4,195,243 | 3/1980 | Thaxter ................. 310/317 |
| 4,894,579 | 1/1990 | Higuchi et al. ........... 310/328 |
| 4,983,975 | 1/1991 | Masaki et al. ......... 310/328 X |
| 5,229,679 | 7/1993 | Higuchi et al. ........... 310/328 |
| 5,325,010 | 6/1994 | Besocke et al. .......... 310/317 |
| 5,410,206 | 4/1995 | Luecke et al. ............ 310/328 |
| 5,410,207 | 4/1995 | Miura et al. ............. 310/328 |
| 5,418,418 | 5/1995 | Hirano et al. ............ 310/328 |
| 5,559,387 | 9/1996 | Beurrier ................... 310/328 |
| 5,568,004 | 10/1996 | Kleindiek ................ 310/328 |
| 5,589,723 | 12/1996 | Yoshida et al. ........... 310/328 |

FOREIGN PATENT DOCUMENTS

| 59-175990 | 10/1984 | Japan . |
| 2-180578 | 7/1990 | Japan . |
| 3-51887 | 6/1991 | Japan . |
| 6-170761 | 6/1994 | Japan . |

OTHER PUBLICATIONS

"Development of multi-degree of freedom ultra-sonic motor for robots," Toyama et al., Lecture, Tokyo University of Agriculture and Technology, Nov. 27, 1990.

*Primary Examiner*—Mark O. Budd
*Attorney, Agent, or Firm*—Cushman, Darby & Cushman IP Group of Pillsbury Madison & Sutro LLP

[57] ABSTRACT

A moving member 2 is rotatably and slidably arranged in a holder 11 having a spherical inner surface 11a. An inertia body 5 is connected to the moving member 2 via a supporting member 4. At a location opposite the inertia body 5, an arm 3 extends so that it is directed outwardly via an opening of the holder. A piezo electric actuator 63 is arranged between the rotating member 2 and the supporting member 4. An elongation of the actuator causes a relative swing movement between the inertia body 5 and moving member to occur in one direction such that a reaction force in the moving member 2 due to the inertia of the inertia body 5 exceeds the frictional force between the moving member 4 and the holder 11, which allows the moving member 4 to be displaced with respect to the holder 11. A contraction of the actuator causes a relative movement between the inertia body 5 and moving member to occur in the opposite direction such that a reaction force in the moving member 2 does not exceed the frictional force, which allows the inertia body to follow with the actuator 63. A reception of the elongation and the contraction allows a movement of the moving member to occur so that it exceeds the limit of the bonding movement of the actuator.

24 Claims, 17 Drawing Sheets

Fig.12
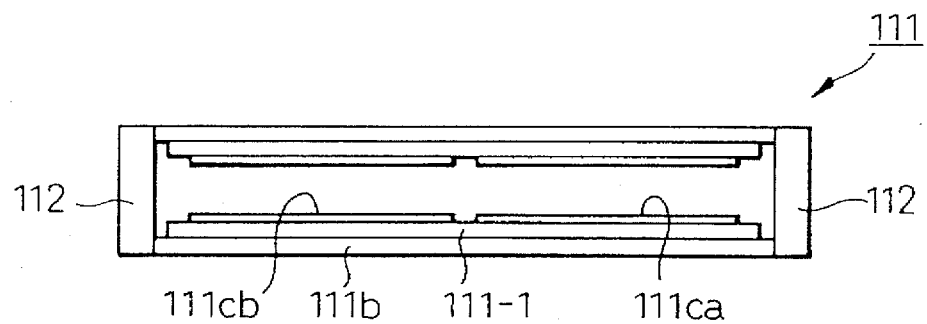
Fig.13A
Fig.13B
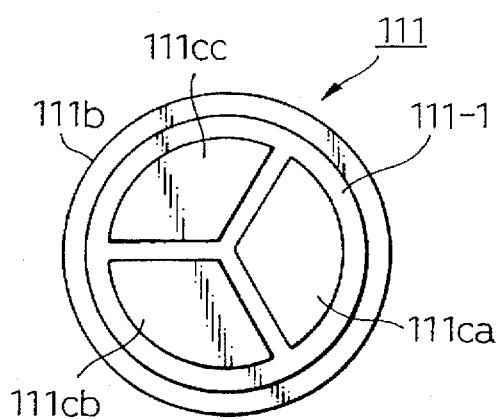
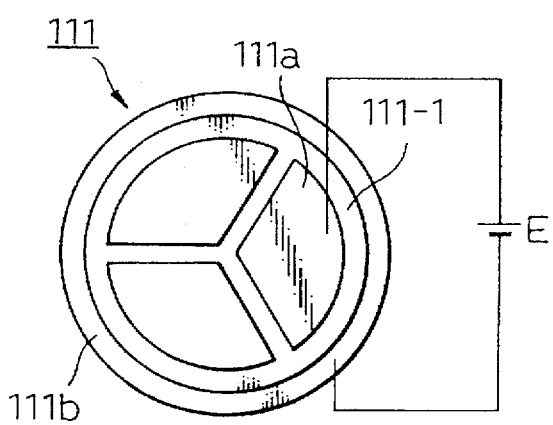
Fig.14A
Fig.14B
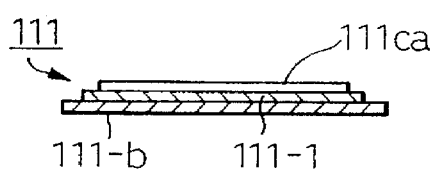
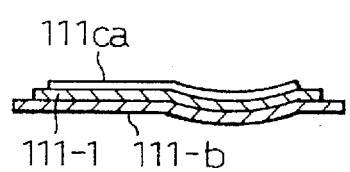

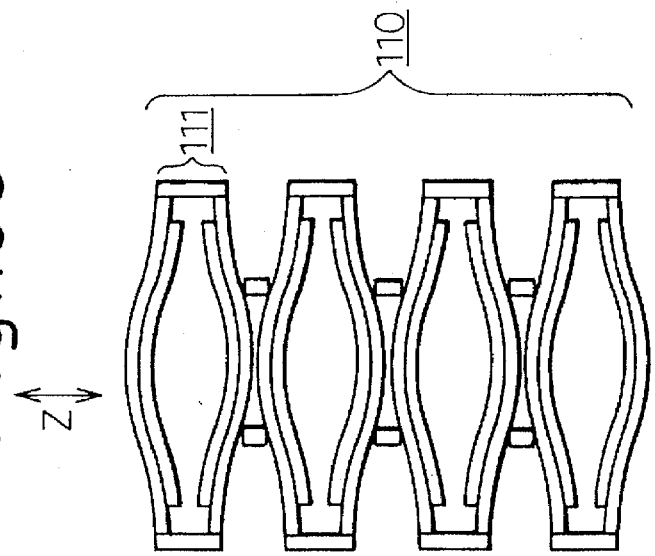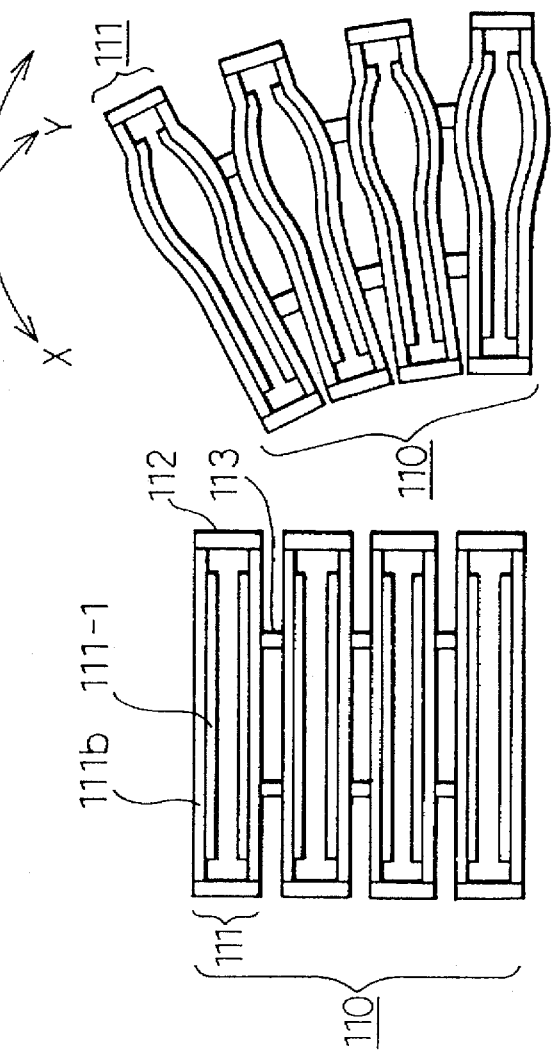

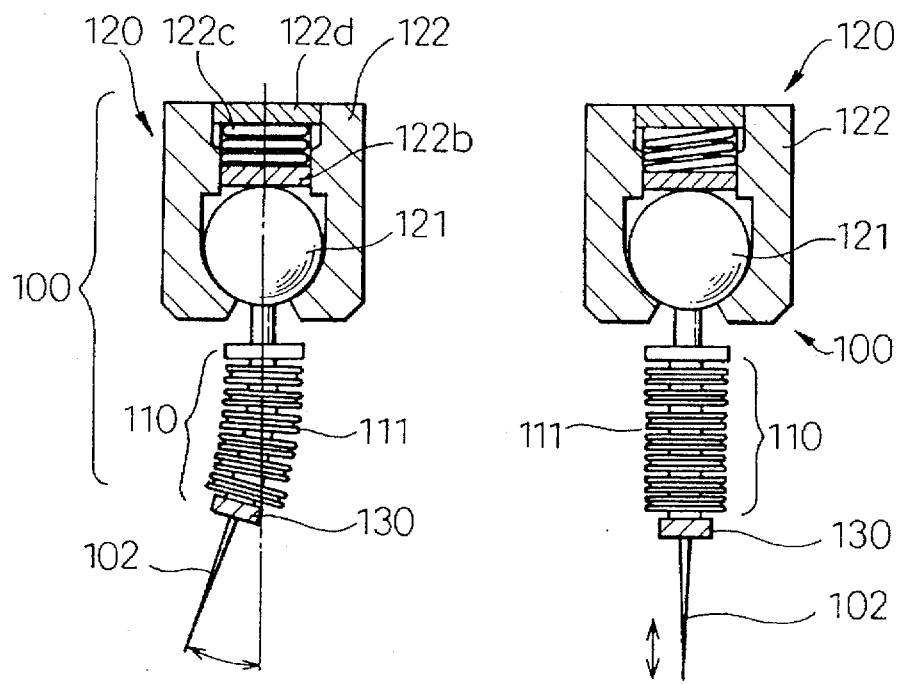
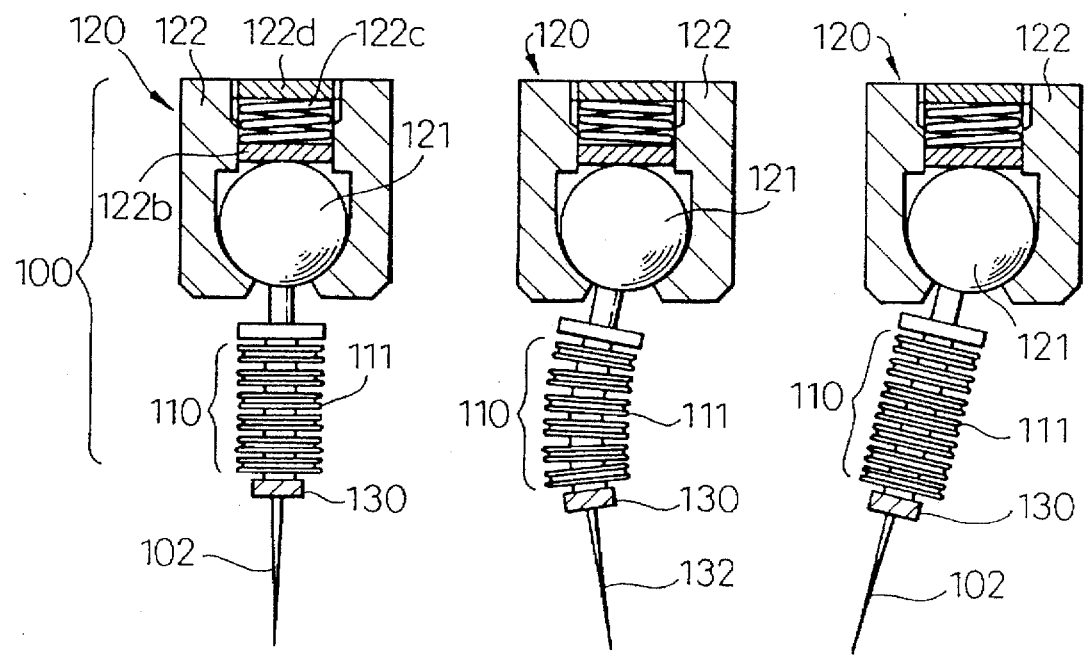

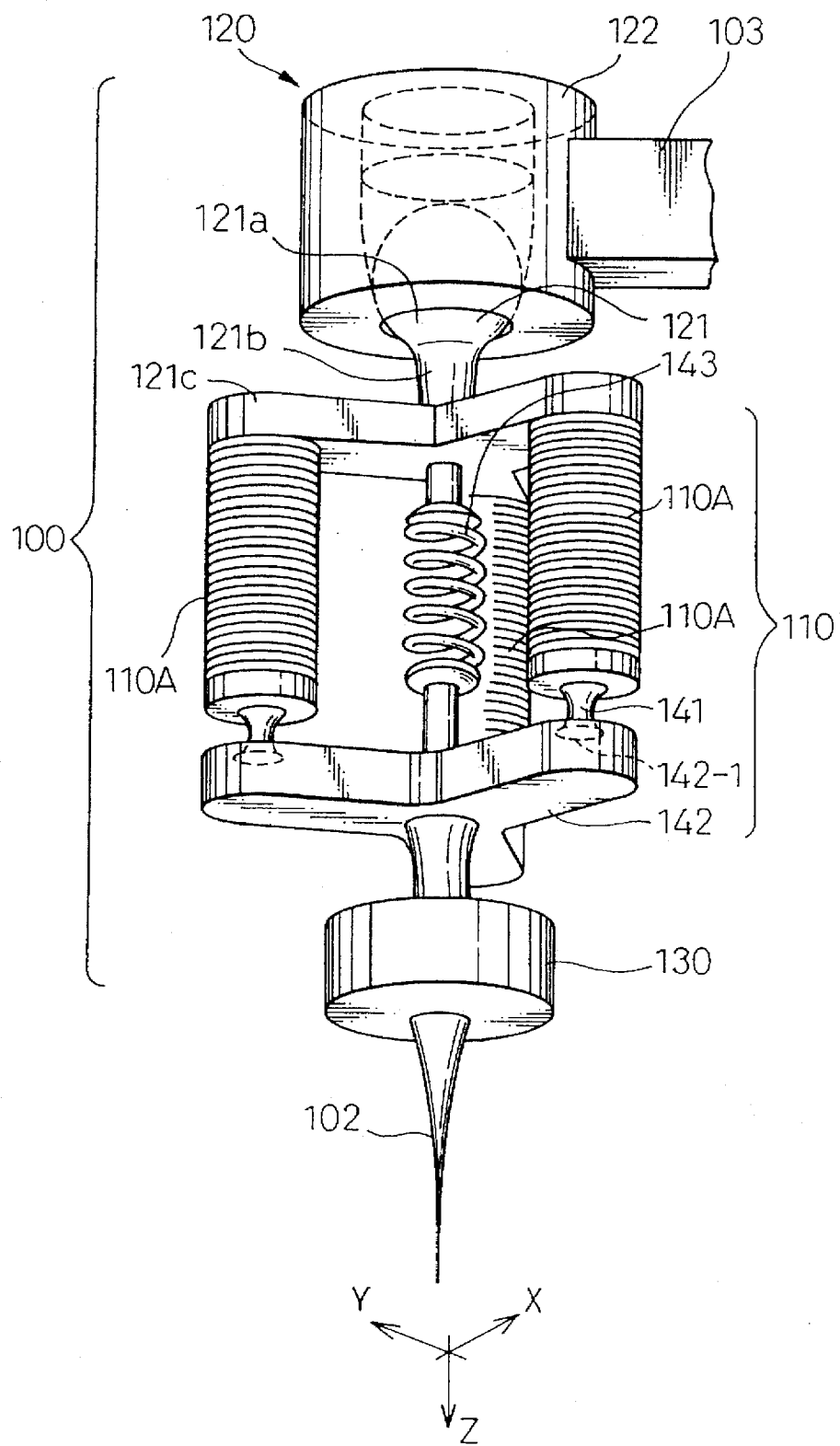

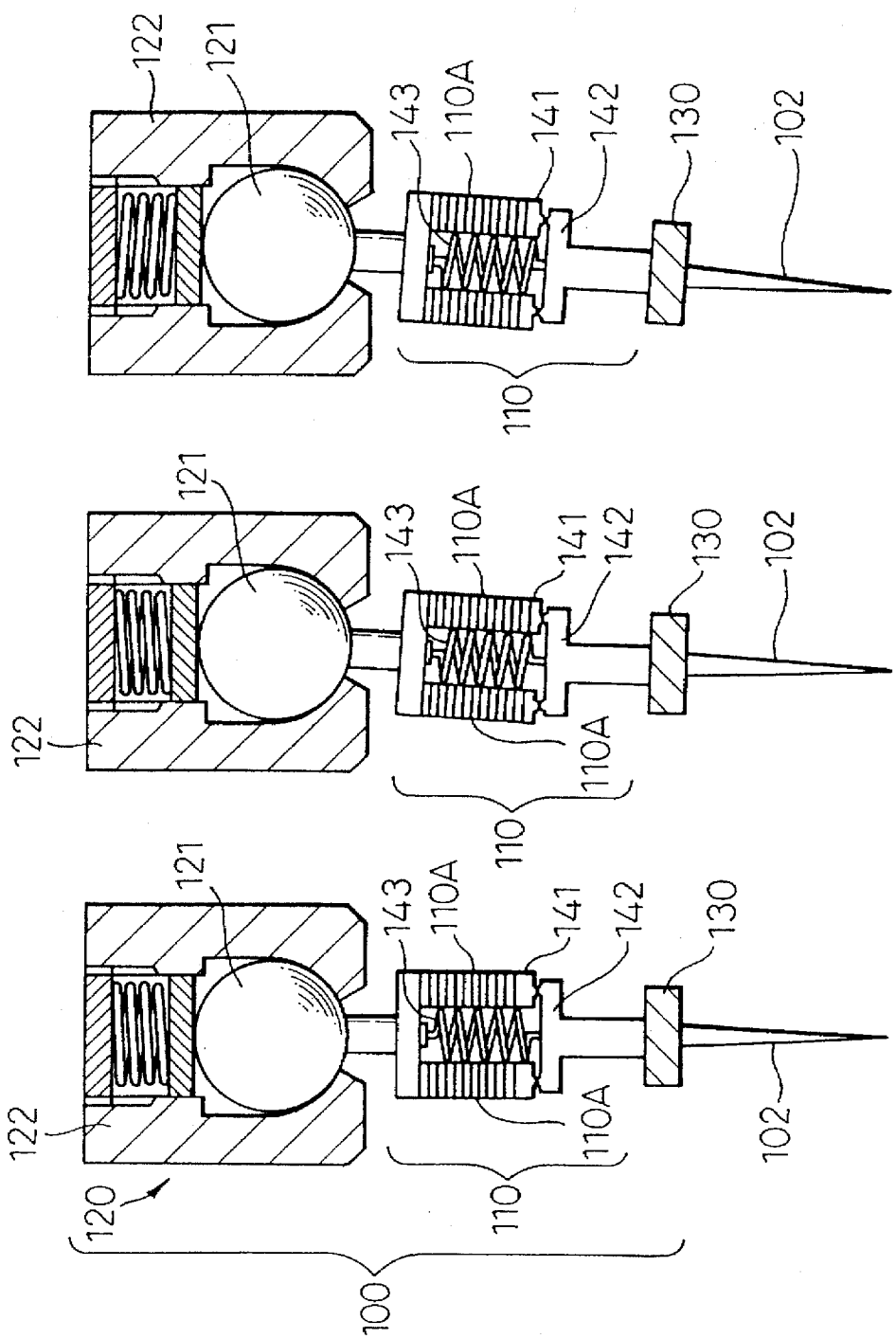

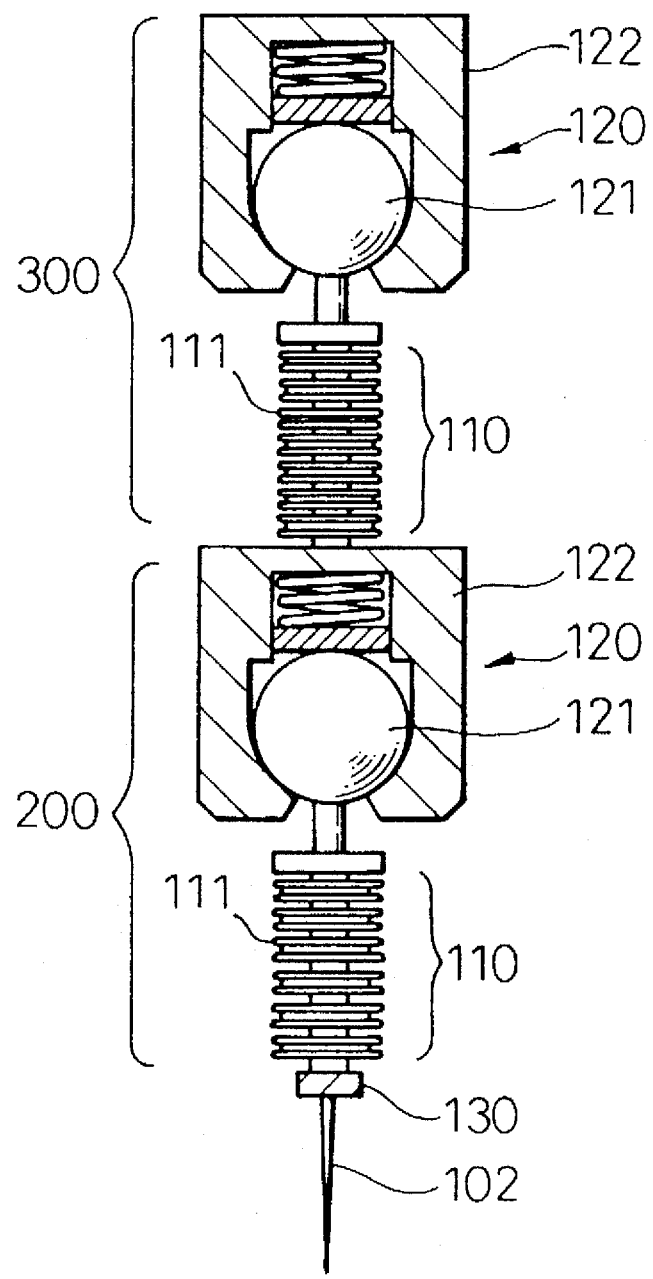

ARTICULATION DEVICE

BACKGROUND OF THE INVENTION

1. Field of the Invention

The present invention relates to an articulation device. More particularly, the present invention relates to a simplified structure of an articulation device using a reaction force generated by an inertia body. The present invention is suitable for an articulation device for effecting a very small movement, of the order of a micrometer or a nanometer, which can be suitably used as a micro-hand.

2. Description of Related Art

In a manipulating apparatus such as an industrial robot, an articulation device is provided for realizing a flexible handling of various objects to be manipulated. Industrial fields wherein control of a movement, on the order of micrometer or nanometer, of a small sized object is required are, for example, semiconductor processes such as positioning device of a water, the biochemistry or medical fields, such as cutting a cell or a cell injection or a fine medical operation, and telecommunication satellite production, for example, positioning an antenna.

A Japanese patent application No. 59-175990 discloses an articulation device, wherein a drive mechanism having a drive motor and a gear train is utilized. However, this type of the articulation device is defective in that the motor as well as the gear train are large, which makes it difficult that this type of the articulation device is used for in field of micromachines, which is becoming important.

In view of the above, various attempts have been made to obtain articulation devices of a simple construction as well as of a reduced size. For example, an articulation device is proposed, wherein a spherical rotor is provided, which has an outer peripheral surface, which is in contact with a ultrasonic driving type stator, so that a translation wave is generated, which causes the rotor to be frictionally driven, which is published by a lecture of Japanese Robot Academy, No. 1136, November 1990. However, this type of device is defective in its short service life due to a continuous frictional contact occurred between the stator and rotor, which causes the parts to be wear quickly.

Japanese Unexamined Patent Publication No. 6-17076 discloses an articulation device having a parallel link mechanism, with six degrees of freedom, having six links each using a telescopic action of a piezoelectric element, which allows, at an end of the articulation mechanism, movement with six degrees of freedom. This type of mechanism is desirable since a fine movement of a micron order can be easily obtained. However, it is defective in that an amount of the movement is very limited.

In view of this, in order to obtain an increased stroke of the articulation mechanism, Japanese Unexamined Patent Publication No. 2-180578 proposes the improved articulation device, wherein an impact force is generated by a rapid movement of inertia bodies, which causes an arm mounted to the articulation device to be moved due to an inertia of the inertia bodies. However, this device is defective in its complicated and large sized structure due to the fact that a plurality of inertial operating mechanisms are mounted on a single arm.

SUMMARY OF THE INVENTION

An object of the present invention is to provide an articulation mechanism of a simplified structure of a small size, wherein a reduction of a precision due to wear is less likely and a process for assembling the device does not require an increased amount of a labor.

Another object of the present invention is to provide an articulation device, capable of obtaining a fine movement, on one hand, while, on the other hand, a relatively rough movement is allowed by using a movement such as an inclination or a rotation.

According to a first aspect of the invention, a moving member, which is rotatable with respect to a holder, is arranged relatively movable with respect to an inertial body and an actuator is arranged between the moving member and the inertia body. The actuator causes the moving member and the inertia body to be relatively moved. Due to an inertia of the inertia body, a reaction force is generated in the moving member which overcomes a frictional force between the moving member and the holder, thereby causing the moving member to be rotated.

The relative movement between the moving member and the inertial body, due to the inertia of the inertia member, can reduce a wear of parts, thereby preventing the precision from being easily reduced and the assembly can be done from effectively. Furthermore, the construction is simplified and is small.

According to another aspect of the present invention, the actuator means, which is arranged between the inertia body and the moving member, generates a relative movement between the inertia body and moving member in one direction such that a reaction force generated on the moving member by the inertia of the inertia body exceeds a frictional force between the moving member and a frictional surface of the holer and generates the relative movement in the opposite direction such that a reaction force generated in the moving member by an inertia of the inertia body does not exceed said frictional force.

Due to the different values of the reaction forces in the moving member between the forward and rearward directions for the relative movement between the inertia body and the moving member, a desired amount of the movement of the moving member is obtained, irrespective of a limited amount of the movement of the actuator, while maintaining a simplified structure of the articulation device, thereby reducing the cost for its production.

According to another aspect of the present invention, a bending movement generator is provided between a rotating member and an inertia body for generating a relative movement therebetween. The relative movement is such that a gradual bending movement of the bending movement generator causes the inertia body to be subjected to a fine movement, and that rapid bending movement of the bending movement generator causes an inertia reaction force to be generated in the moving member due to the inertia of the inertia body, thereby causing the moving member to be slidably moved with respect to the contacting surface of the holder member against said frictional force, causing the inertia body to be subjected to a rough movement.

In the present invention, a desired rough movement is obtained while using a bending movement generator of a limited extent of a movement, while keeping a possibility of a fine adjustment. Thus, the structure is prevented from being a large sized and complicated and the production cost can be reduced.

BRIEF DESCRIPTION OF ATTACHED DRAWINGS

FIG. 12 is a side view of a piezo-electric unit in an actuator in the fourth embodiment.

FIG. 13A is a side view of a piezo-electric element in the piezo-electric unit in the actuator in the fourth embodiment.

FIG. 13B is the same as FIG. 13A but shows the piezo-electric unit when it is operated.

FIG. 14A is a cross sectional view of the piezo-electric element in FIG. 13A.

FIG. 14B is the same as FIG. 14B but shows the piezo-electric unit when it is operated.

FIG. 15A shows a side view of the actuator in the fourth embodiment.

FIG. 15B is the same as FIG. 15A but shows the actuator when it is subjected to a handling movement.

FIG. 15C is the same as FIG. 15A but shows the actuator when it is subjected to an elongation movement.

FIG. 16A shows a side view of the articulation device in the fourth embodiment but shows an actuator is subjected to a bending movement in at a fine movement mode.

FIG. 16B shows a side view of the articulation device in the fourth embodiment but shows the actuator when it is subjected to an axial elongation movement at the fine movement mode.

FIG. 17A shows a side view of the articulation device in the fourth embodiment but shows a condition wherein the actuator is de-energized in a rough movement mode.

FIG. 17B shows a side view of the articulation device in the fourth embodiment but shows a condition wherein the actuator is subjected to a bending movement during a rapid movement period in the rough movement mode.

FIG. 17C shows a side view of the articulation device in the fourth embodiment but shows a condition wherein the actuator is straightened during a slow movement period in the rough movement mode.

FIG. 18 shows a perspective view of an articulation device in a fifth embodiment.

FIG. 20A shows a side view of the articulation device in the fifth embodiment but shows a condition wherein the actuator is de-energized in a rough movement mode.

FIG. 20B shows a side view of the articulation device in the fifth embodiment but shows a condition wherein the actuator is subjected to a bending movement during a rapid movement period in the rough movement mode.

FIG. 20C shows a side view of the articulation device in the fifth embodiment but shows a condition wherein the actuator is straightened during a slow movement period in the rough movement mode.

FIG. 21 is a schematic side view of an articulation device in a sixth embodiment of the present invention.

DESCRIPTION OF PREFERRED EMBODIMENTS

Now, an embodiment of the present invention will be described with reference to the attached drawings.

First Embodiment

Figure 1:
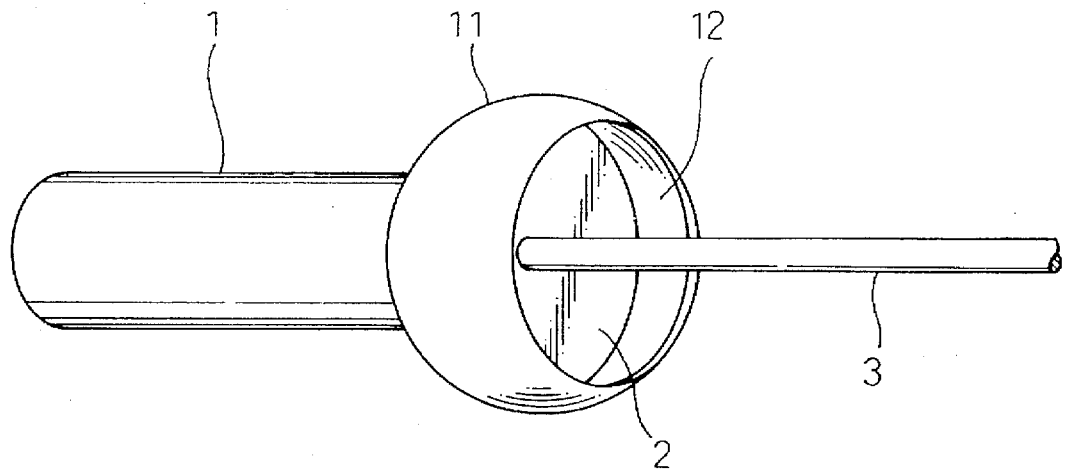
FIG. 1 is a schematic perspective view of an articulation device of the first embodiment of the present invention.

In FIG. 1, an articulation device includes a base 1 in a form of a rod shaped arm, which is made stationary or connected to a stationary member (not shown). The base 1 is, at its end, provided with a holder portion 11, which is formed as a shell of a spherical shape, which has an opening 12 at a location opposite the base 1.

Figure 2:
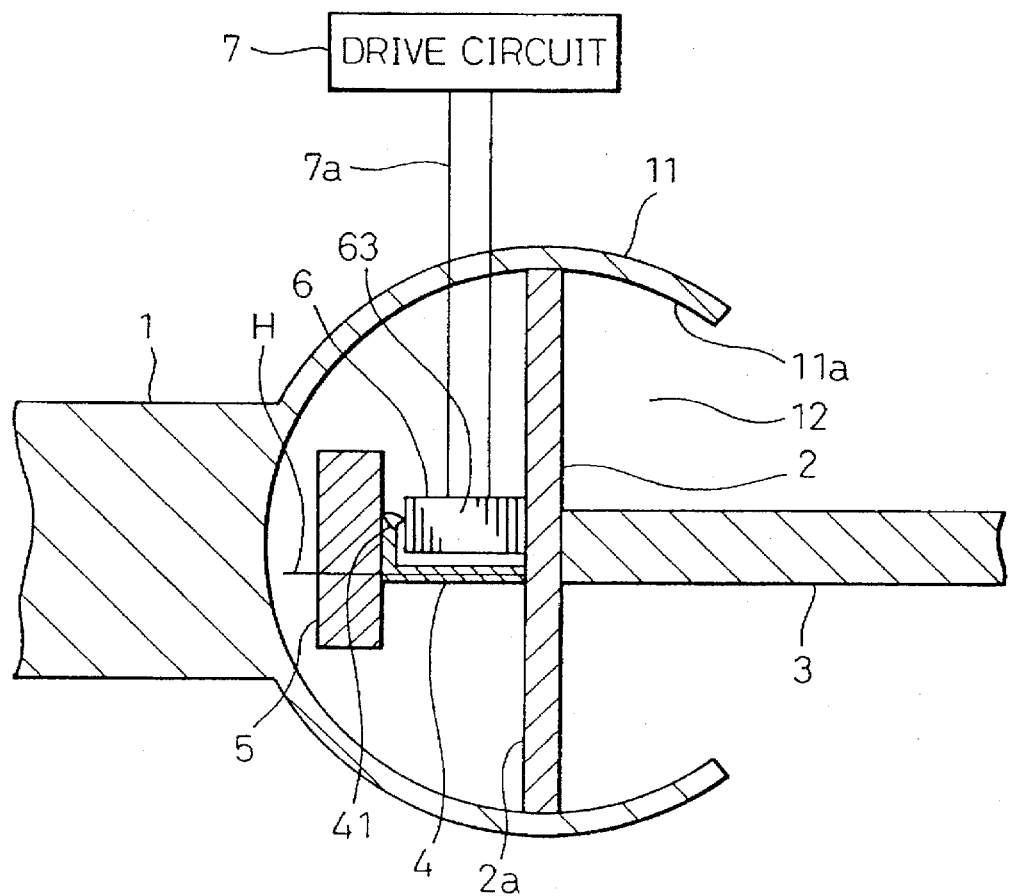
FIG. 2 is a cross-sectional view of the articulation device in FIG. 1.

Arranged in the shell 11 is a moving member 2, to which a rod shaped arm (or finger) 3 is fixedly connected in such a manner that the finger 3 is extend outwardly via the opening 12. A tool (not shown) is connected to the arm 3 for working a workpiece (not shown). As shown in a cross sectional view of the articulation device in FIG. 2, the moving member 2 is formed as a circular disk. The holder portion 11 has an inner surface 11a, which is a part of a complete sphere. The moving member 2 as the circular disk is located on a diametrical plane of the sphere. In other words, the circular disk shaped moving member 2 has a center, which coincides with that of the holder 11. Thus, an outer peripheral surface of the moving member 2 is in a slidable contact with an inner spherical surface 11a of the holder 11. As a result, a frictional force is generated between the moving member 2 and the holder 11. As shown in FIG. 2, a supporting member 4 extends integrally from an end surface 2a of the moving member 2 remote from the arm 3 along a line H which is transverse to the plane of the rotating member 2. The support member 4 is made as a plate having a certain degree of an elasticity, and the supporting member 4 is, at its first end, fixedly connected to the moving member 2. In place of providing the elasticity in the supporting member 4, it may be possible to construct so that the moving member 2 have an elasticity, which allows the member 2 and 4 to be relatively moved under the action of the inertia force. At a second end remote from the moving member 2, the supporting member 4 is bent at a right angle so as to form a L-shaped support plate portion 41, on which an inertia member 5 of a desired weight is fixedly connected. A piezo-element stacked assembly (a bending movement generator) 63, which functions as a swing angle varying means, is arranged between the moving member 2 and the support plate portion 41. The assembly 63 is constructed by a plurality of piezo-electric plates in a stacked condition and is in an electrical connection with a drive circuit 7. In a manner as will be explained later, the drive circuit 7 issues an electrical signal 7a, which causes the stack to be expanded or shrunk in a longitudinal direction, i.e., in the stacked direction.

Figure 3:
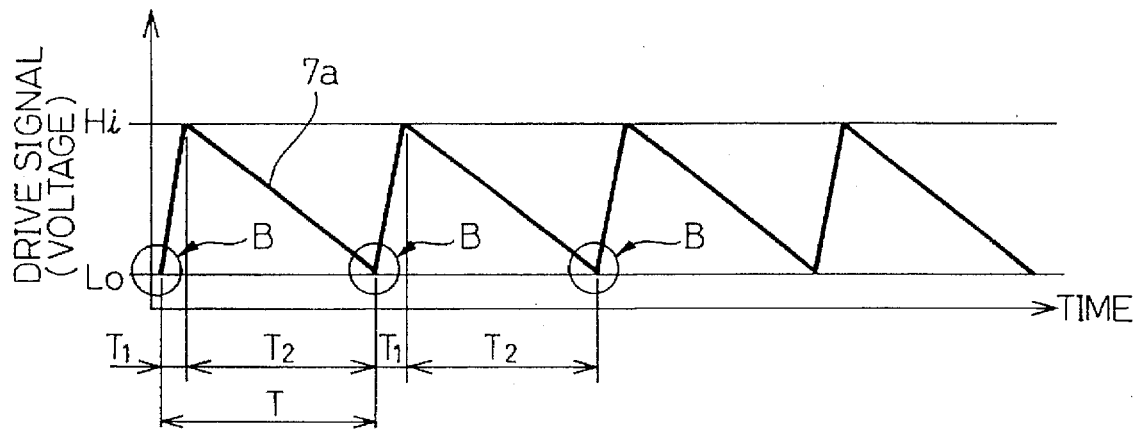
FIG. 3 shows a wave form of a drive signal of the articulation device in FIG. 1.

FIG. 3 illustrates a wave form, i.e., time v.s. voltage chart, of the drive signal 7a from the drive circuit 7. As will be easily seen from FIG. 3, the drive signal 7a is constructed as a triangle wave of a predetermined cycle T. Namely, the complete one cycle T is constructed by a first (or front) period $T_1$, wherein the value of the electric voltage is rapidly increased at a steep slope and by a second (or rear) period $T_1$, wherein the value of the electric voltage is slowly reduced at a shallow slope. Thus, an elongation or a shrinkage of the stack 63, which is substantially proportional to such a change of the electric voltage along the wave form, is obtained. In other words, during the period $T_1$, the piezo-electric stack 63 is subjected to a rapid expansion, and, during the period $T_2$ to a slow contraction.

Figure 4:
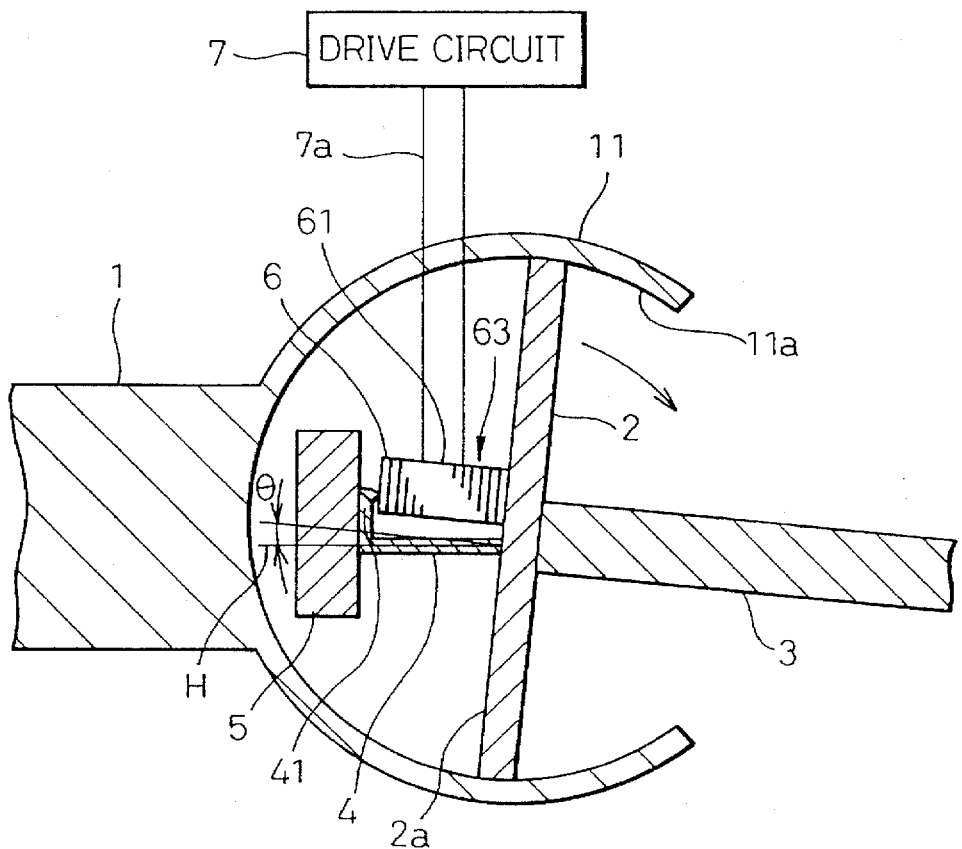
FIG. 4 is a cross sectional view of the articulation device of the first embodiment when it is operated.

FIG. 4 shows the articulation device when the piezo-electric stack 63 is under the elongated condition. Namely, the elongation of the piezo-electric stack 63 urges the supporting member 4 to be rocked in a positive direction (a counter clockwise direction in FIG. 4). As explained above, the elongation of the piezo-electric stack 63 is done very rapidly, which causes a very rapid angular acceleration to be generated at an initial stage of the elongation as shown by portions B in FIG. 3. As a result, a large reaction force, which is dependent on the inertia mass of the inertia body 5, is generated in the moving member 2 via the supporting member 4. Due to the fact that the inertia reaction force is larger than the stationary frictional force, a self rotating movement of the moving member 2 in a clockwise direction as shown by an arrow in FIG. 4 opposite to that of the supporting member 4 is commenced at an angle θ with respect to the line H. Namely, the supporting member is elastically flexed about a location where the first end of the supporting member 4 is connected to the moving member 2. The frictional force of the moving force is small after the commencement of the self rotating movement, and therefore the reaction force, if it is small, causes the moving member 2 to continue its movement, so that a self rotation of an angle, which is substantially equal to the rocking angle θ, is finally obtained. Thus, the arm 3 fixedly connected to the moving member 2 effects the rotating movement of the same angle. It should be noted that, during these operation, the inertia body 5 is maintained substantially stationary.

After the completion of the elongation, the phase $T_1$ of the operating signal in FIG. 3 comes, which causes the contraction of the piezo-electric stack 63 to be done slowly. In this case, a reaction force generated in the rotating body 2 during the reversal movement of the supporting member 4 does not exceed the frictional force between the moving member 2 and the holder 11, which causes the moving member 2 to be maintained substantially stationary, while the inertia body 5 is moved in a clockwise direction in FIG. 4.

In short, the application of the drive signal of a cyclically varied voltage level to the piezo-electric stack causes the moving member 2 to be intermittently self-rotated in the holder portion 11 at a cycle which is identical with that of the drive signal 7a, thereby causing the arm 3 to be intermittently rotated. Thus, a working member (tool) connected to the arm 3 is also moved correspondingly.

In the articulation device according to the present invention, the turning movement of the arm 3 is generated by a reaction force acting from the inertia body 5. Thus, when compared with a prior art, where an electric motor as well as a gear mechanism are employed, the present invention makes it possible that the construction is simplified, on one hand, and, on the other hand, the size is reduced. Furthermore, the driving mechanism is free from any problem of a wear, and the required degree of precision is not so high, which makes the assembling process easy.

Second Embodiment

Figure 5:
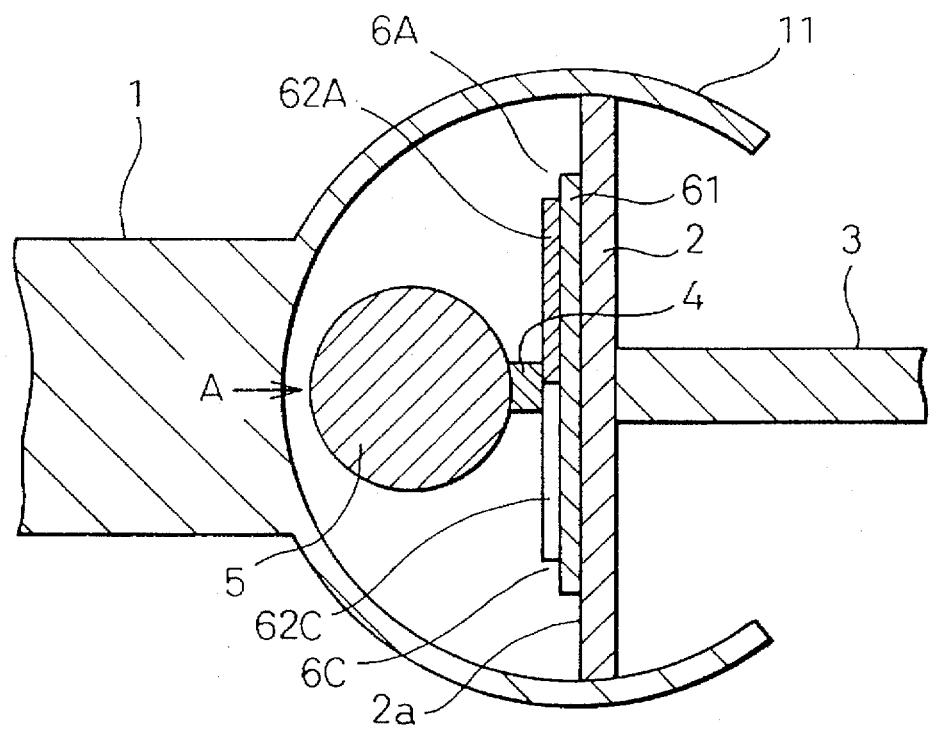
FIG. 5 is a cross sectional view of an articulation device in a second embodiment, taken along a line V—V in FIG. 6.
Figure 6:
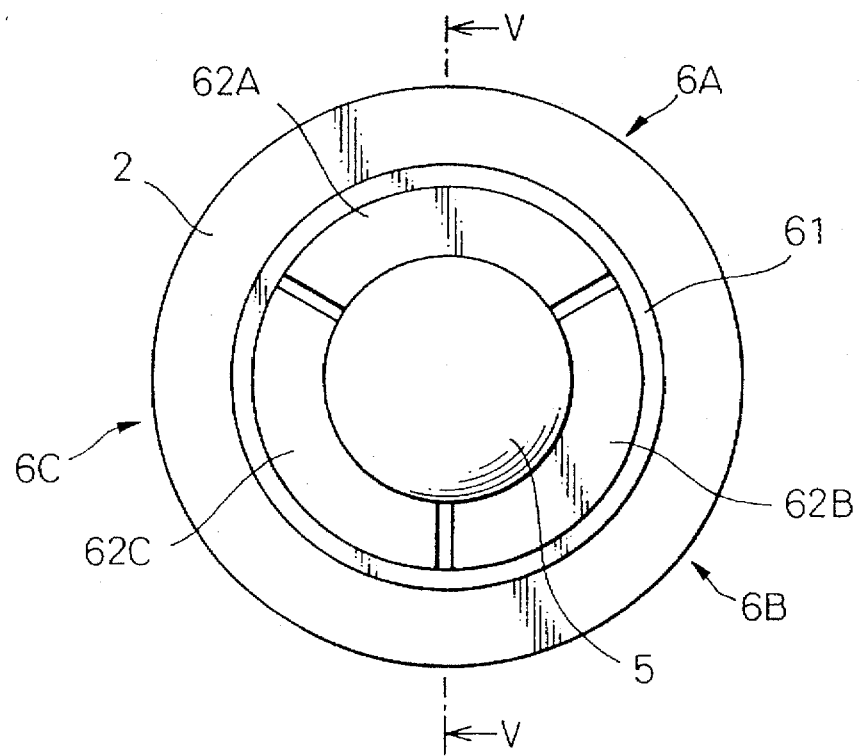
FIG. 6 is a view taken along an arrow VI in FIG. 5.

FIGS. 5 and 6 show a second embodiment of the present invention. The moving member 2 stored in the holder portion 11 is made as an electrically flexible circular disk made of a certain metal material of a relatively small thickness. Connected to an inner side wall of the moving member 2 is a piezo-electric circular disk 61 formed by a material such as PZT. In this embodiment, three equiangularly spaced swing angle variation means 6A, 6B and 6C are provided as shown in FIG. 6. These swing angle variation means 6A, 6B and 6C are constructed by angularly spaced three arc shaped electrode plates 62A, 62B and 62C, respectively, which are formed by a printing on the inner surface of the piezo-electric disk 61. As shown in FIG. 5, the supporting member 4 is arranged in a rectangular relationship on a central plate part 6a of the piezo-electric actuator. At an end of the supporting member 4, an inertia body 5 of a spherical shape is fixedly connected. A drive circuit as similar to that explained with reference to the first embodiment with reference to FIG. 2 is connected to each of the electrodes 62A, 62B and 62C, to which a drive signal as similar that explained with reference to FIG. 3 is selectively applied. Finally, in this embodiment, the moving member serves, also, as a ground electrode.

Figure 7:
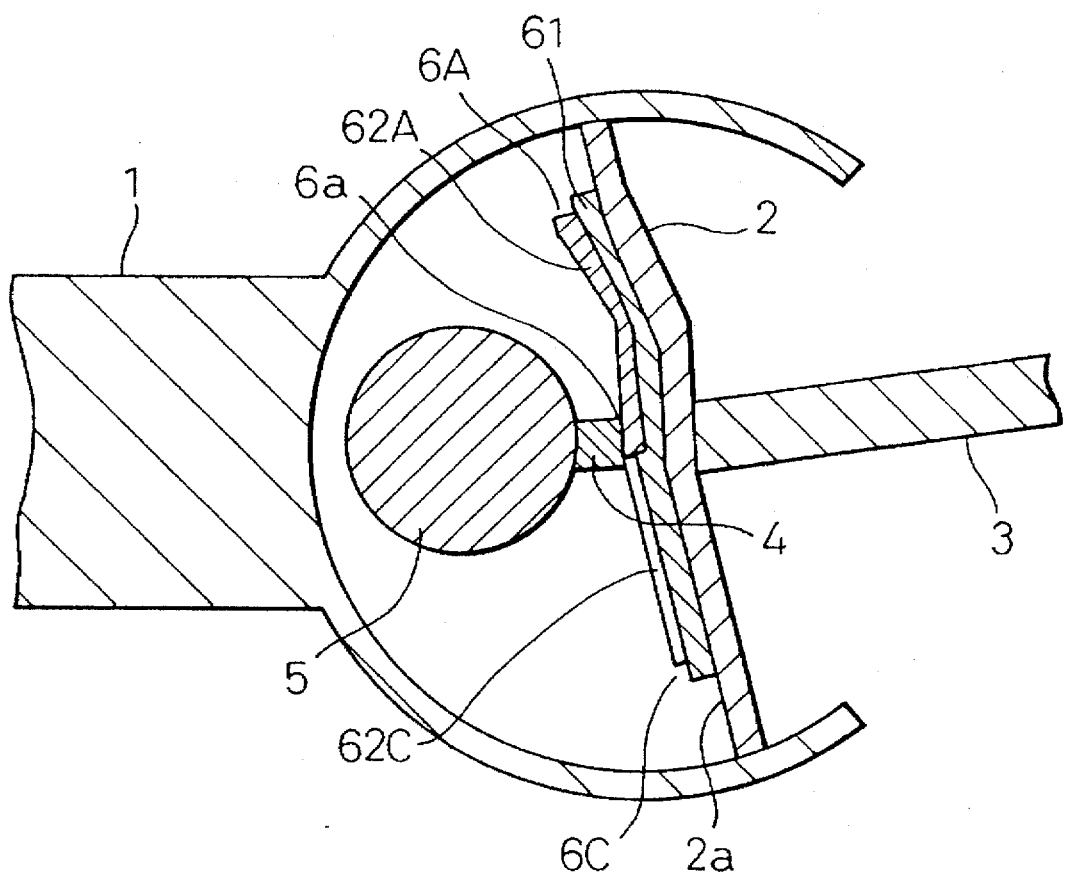
FIG. 7 is a cross sectional view of the articulation device in the second embodiment when it is operated.

Now, an operation of the second embodiment will be explained. Namely, FIG. 7 illustrates a condition when a drive signal is applied the electrode 62A, while the electrodes 62A and 62B are de-energized. Due to a rapid application of the electrical voltage during the period $T_1$ in FIG. 3, the piezo-electric plate 61 is subjected to a rapid contraction of its diameter at a portion sandwiched between the electrode plate 62A and the wall surface 2a of the moving member 2. As a result, at the portion, the wall 2a of the moving member 2 is subjected to a bending in an axially outward direction. Due to such a bending, the central plate portion 6a of the actuator functioning as a mounting surface of the supporting member 4 is urged to be inclined in a direction toward the electrode plate 62A, so that the supporting member 4 is also urged to be swung in this direction (a clockwise direction in FIG. 7). As a result, a reaction force is generated in the moving member 2 due to the inertia of the inertia body 5, thereby causing the moving member 2 to be rotated in a direction (a counter clockwise direction in FIG. 7) opposite to the direction where the supporting member 4 is swung. As a result, a turning movement of the arm member 3 is obtained.

In the construction of this second embodiment, the structure of the swing angle varying means 6A to 6C allows the supporting member 4 to be swung in a plurality of (three) diametric planes. In other words, a rotating movement of the arm member in each of the different diametrical planes can be obtained.

In the second embodiment, an increase in the number of division of the electrode allows a possible number of directions of the movement of the arm 3 to be increased to a number more than 3. In such an increased divided structure, a suitable adjustment of the voltage of the drive signal applied to the respective electrodes, which are located adjacent with each other, allows the plate portion 2a of the moving member 2 to be flexed in a desired direction, for allowing the supporting member 4 to be swung. As a result, the arm member 3 can be turned in a desired direction.

Furthermore, in this embodiment, it is possible to provide a circuit, which controls a voltage level of, and an output timing of, drive signals supplied to drive circuits connected to the respective electrodes in such a manner that the supporting member 4 is swung for a predetermined fixed amount in the diametrical plane while controlling in a sequential manner an application of an electrical voltage to the electrodes, which are adjacent with each other. Due to such a sequential control of the application of the electrical voltage, it is possible that, in a circumferential direction of the moving member 2, the supporting member 4 is moved rapidly in the positive direction and is moved slowly in the negative direction. As a result, the moving member 2 is rotated while an inclination of the latter is unchanged, thereby allowing the arm member 3 to be self-rotated about its own axis.

Third Embodiment

Figure 8:
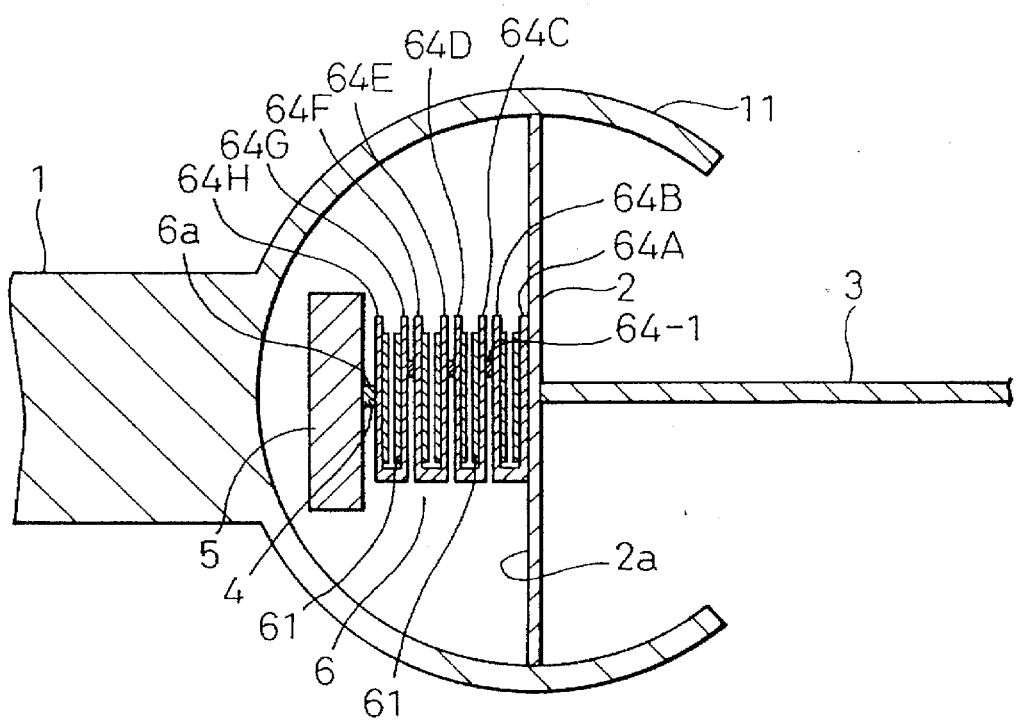
FIG. 8 is a cross sectional view of an articulation device in a third embodiment.

In FIG. 8, the swing angle changing means 6 is constructed by a plurality of metal plates 64A to 64H of a U-cross sectional shape, to each of which a piezo-electric plate element 61 is connected (adhered). The metal plates 64A to 64H with the piezo-electric elements 61 are stacked in such a manner that the piezo-electric elements 61 between the adjacent plates face each other. Such a structure of the piezo-electric elements 61 on the metal plate is usually called a uni-morph structure.

In this embodiment, the metal plates, which are adjacent to each other, are connected with each other by means of connecting pieces 64-1. A supporting element 4 is connected to a middle portion of an outer surface wall of the bending movement generator. An inertia body 5 is supported by the supporting member 4. Thus, the metal plates 64A to 64H function also as a support of the inertia body 5, while allowing the moving member 2 and the inertia body 5 to be swung with each other.

Figure 9:
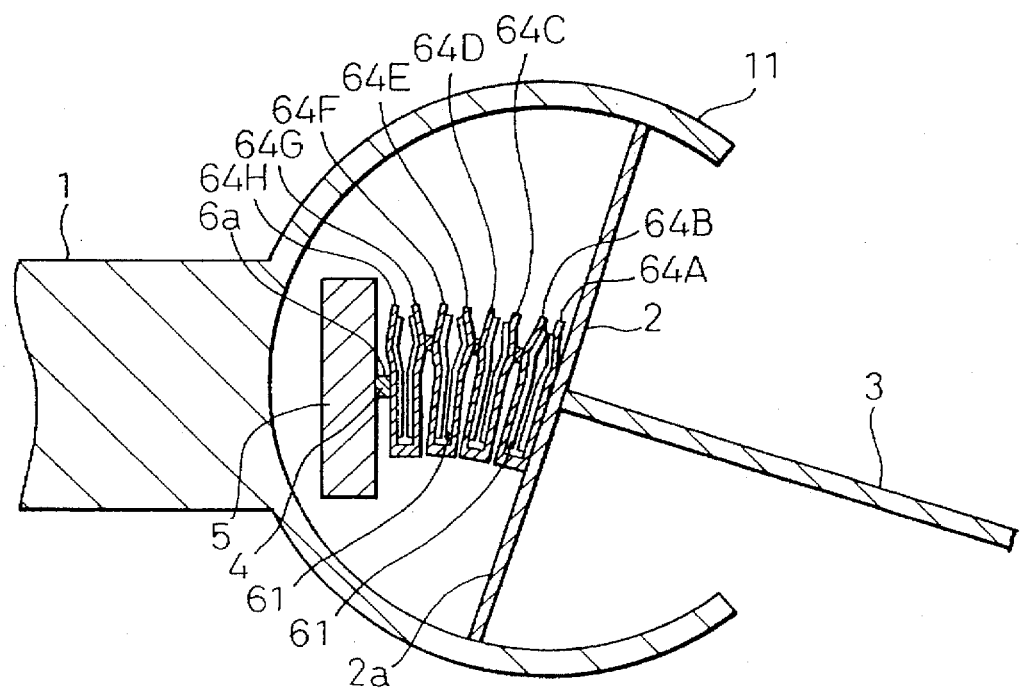
FIG. 9 is a cross sectional view of the articulation device in the third embodiment when it is operated.

An application of a voltage drive signal to electrodes (not shown) formed on the piezo-electric plates 61 causes their diameter to rapidly shrink, which causes the metal plates 64A to 64H to be bent (towards each other), as shown in FIG. 9. Due to the fact that the metal plates 64-1, the displacements of the metal plates 64A to 64H are added, so that the mounting portion 6a of the supporting member 4 is largely inclined, thereby causing the supporting member 4 to be urged to swing. Thus, the inertia of the inertia body 5 generates a reaction force the moving member, causing the moving member 2 to be subjected to a self-rotating movement, thereby causing the arm member 3 to be turned. This embodiment can, also, obtain advantages as described with reference to the first and second embodiments. Furthermore, an increased amount of the displacement of the bending movement generator means, due to the stacked structure of the piezo-electric elements, is obtained.

In the embodiments explained above, in order to obtain a self-rotating movement of the moving member, a voltage level of the drive signal 7a for operating the piezo-electric element is steeply increased at a first period $T_1$, compared to later one $T_2$, in one cycle T of the signal. In place of this, a steep increase can be obtained at a later period over a front period in one cycle of the operating signal in order to obtain a self-rotating member of the moving member 2.

Furthermore, the wave form of the drive signal 7a need not necessarily be a triangle wave. For example, the reduction of the voltage level and be done along a quadratic curve, which can obtain a uniform degree of an acceleration. In other words, any control can be employed so long as a control of the reaction force in the moving member can be done so that the reaction force can periodically exceed a static friction force of the moving member 2. Furthermore, the moving member need not necessarily be intermittently rotated. If a single rotating member of the movement member 2 is sufficient, the drive signal 7a need not necessarily be a cyclic one.

Furthermore, when the rotating movement of the moving member is done in a single plane, the holder 11 is not necessarily a spherical shape, i.e., the holder 11 will be sufficient if it has an arc shaped cross section in the rotating plane.

Finally, the supporting member 4 can be mounted on one side of the moving member 2 adjacent the arm 3. Namely, in this case, the arm can function also as an inertia body, which is highly advantageous in its simplified structure. Furthermore, a construction is also possible where the supporting member 4 functions itself as the inertia body.

Fourth Embodiment

Figure 10:
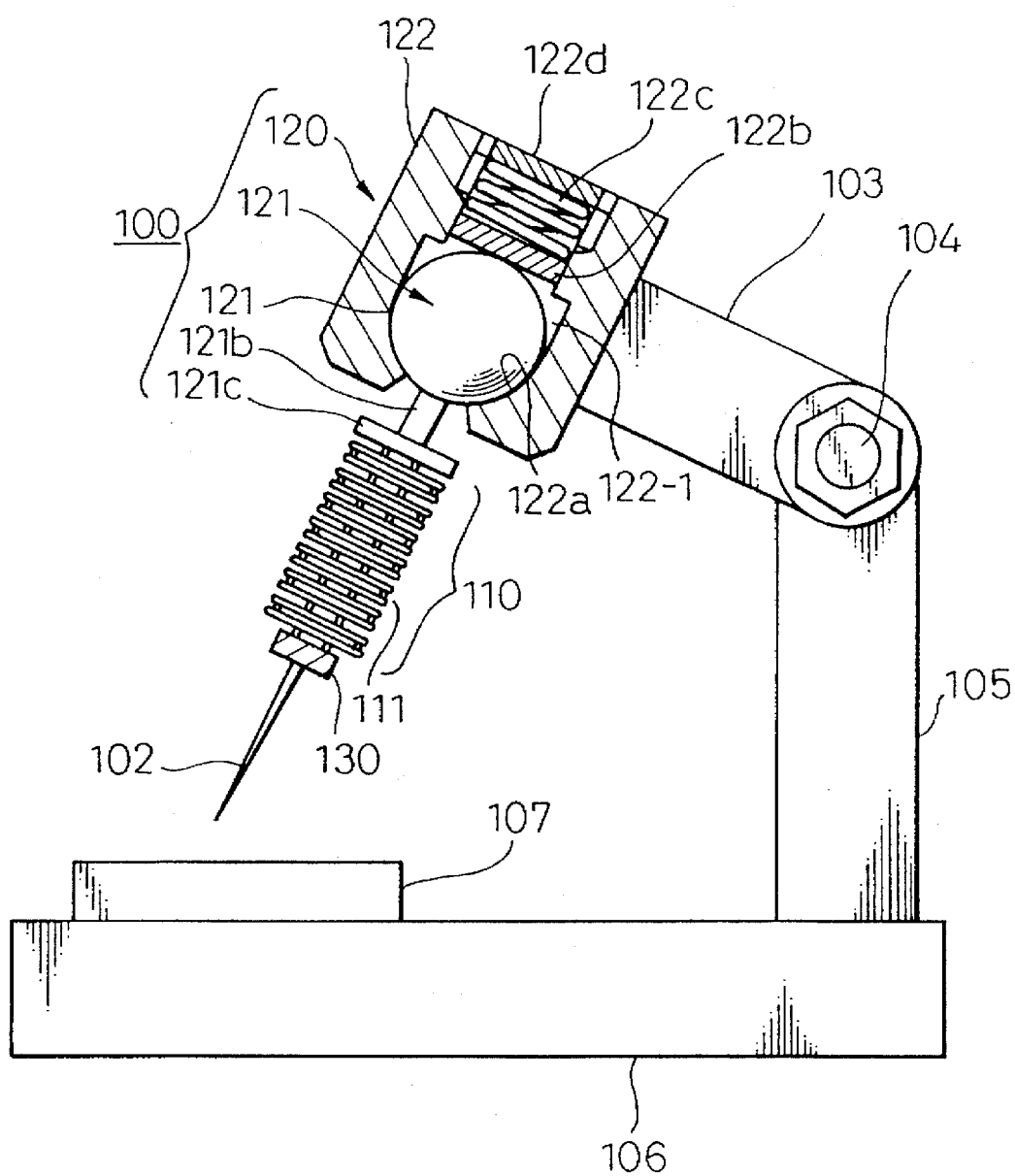
FIG. 10 is a side view, partially cross sectioned of an articulation device in a fourth embodiment according to the present invention.
Figure 11:
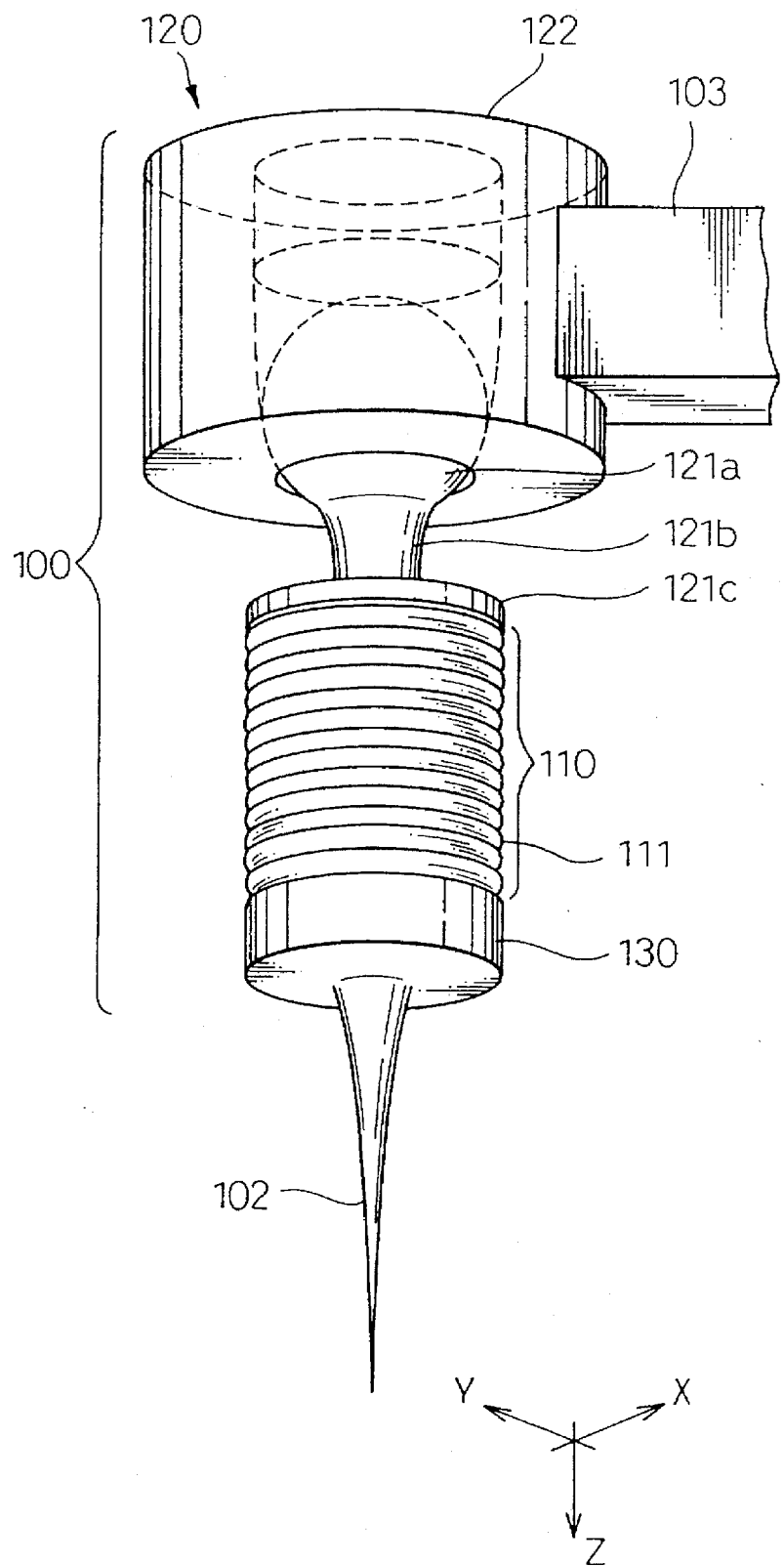
FIG. 11 is a perspective view of the articulation device in the fourth invention.

FIGS. 10 to 17 show a fourth embodiment of an articulation device of the present invention. This embodiment is directed to a capability for selection of the movement between a fine one and a rough one. FIG. 10 shows an application of the present invention to a micro manipulator, which includes an articulation device (finger) 100, a finger member 102 at an end of the articulation device 100, an arm 103 for supporting the articulation device 100, a post 105 for supporting the arm 103 rotatably about a pin 104 and a base plate 106 for supporting the post 105, so that the latter extends vertically. A work piece 107, which is to be subjected to working by the manipulator, is mounted on the base plate 106.

The articulation device 100 is constructed by a bending movement generator including an actuator 110 (a stack of piezo-electric elements), an articulation unit 120 and an inertia body 130. The bending movement generator 110 has one end, which is in connection with the inertial body 130, to which the finger member 102 is connected. The finger member 102 is, in particular, formed as a tool for working the workpiece such as a micro needle or a micro blade or a micro capillary.

The articulation unit 120 is constructed by a moving member 121 of a spherical shape, and a holder member (housing) 122 for building therein the moving member 121 under a frictional force. From the spherical shaped moving member 121, a supporting member 121b having a certain degree of rigidity is outwardly extended. A flange portion 121c of the same degree of a rigidity as that of the rod member 121b is fixedly connected to an end of the supporting member 121b remote from the spherical shaped moving member 121. The actuator or generator 110 as a stack of piezo-electric elements is, at an end remote from the finger 102, fixedly connected to the flange part 121.

In FIG. 10, the holder member 122 of the articulation device 100 is formed with a recess 122-1 for receiving therein the spherical shaped moving member 121. Namely, the holder portion 122 has an inner surface 122a, which is under a frictional contact with the spherical moving member 121. The articulation device 100 is further provided with a pressor plate or braking member 122b in contact with the moving member 121 and a spring 122c, which generates a force urging the moving member 121 to be sliding contact with the surface 122a. The contact of the moving member 121 to the sliding surface 122a by the spring 122c generates a frictional force between the moving member 121 and the surface 122a of the member 122. An adjusting screw 122d is provided at the end of the holder member 122, which allows a displacement of the spring 122c to be adjusted, thereby adjusting the frictional force (braking force) between the moving member 121 and the sliding surface 122a.

In the embodiment in FIG. 10, the moving member 121 of a spherical shape, which is in sliding contact with the spherical surface 122a of the holder 122, is employed for obtaining a movement of the articulation unit 120 of a degree of freedom of two, i.e., movement both in X and Y directions. See FIG. 11. However, when only a unidirectional movement in the X or the Y direction (degree of freedom of the movement of 1) is needed, a circular cylinder sliding member can be employed in place of the spherical member 121.

Similar to the embodiment in FIG. 8, the bending movement generator 110 is constructed as a stack of a plurality of piezo-electric units 111, each of which is formed as a piezo-uni-morph or piezo-bi-morph unit. Namely, as shown in FIG. 12, each of the piezo-electric unit 111 is comprised of piezo-electric elements 111-1 made of piezo-uni-morph or piezo-bi-morph material, metal supporting plates 111b, on which the piezo-electric elements 111-1 are formed, spacer members 112 for connecting the supporting plates 111b with each other, and electrodes 111ca, 111cb and 111cc on the piezo-electric elements 111-1 opposite the base plates 111b. The piezo-electric elements 111-1 in the unit 11 as well as the electrodes 111ca, 111cb and 111cc are arranged so as to be faced each other. As shown in FIG. 13A, the electrodes 111ca, 111cb and 111cc on each of the piezo-electric elements 111-1 form a complete circle slit along three equiangularly spaced lines. In other words, each of the electrodes 111ca, 111cb and 111cc forms a shape of a fan of an angular extension of substantially 120°. Namely, the piezo-electric element 111-1 can be electrically loaded only at three circumferentially spaced locations.

The piezo-electric element 111-1 maintains its flat shape as shown in FIG. 14A under a non energized condition. When a voltage difference E is created between the metal base plate 111-b and at least one of the electrodes 111ca, 111cb and 111cc, a portion of the piezo-electric element 111-1 corresponding to the energized electrode is displaced transverse to the plane of the piezo-electric element 111-1. Namely, such a voltage difference E is, for example, applied between the base plate 111b and the electrode 111ca as shown in FIG. 13B, the portion of the piezo-electric element 111-1 is displaced in the transverse direction, i.e., the piezo-electric element becomes convex as shown in FIG. 14B. In other words, an axially asymmetrical deformation of the piezo-electric element is obtained. Contrary to this, when the same voltage difference is applied between the metal base plate 111-b and each of the electrodes 111ca, 111cb and 111cc, an axially symmetrical deformation of the piezo-electric element will be obtained.

As shown in FIG. 12, in each of the piezo-electric units 111, the piezo-electric elements 111-1 are arranged to face with each other, while the piezo-electric element 111-1 are connected with each other by means of the spacer members 112 made of an electrically insulating material.

As shown in FIG. 15A, in the stacked structure 110, the piezo-electric units 111 are stacked with each other, while space members 113 made of an electrically insulating material are arranged between the piezo-electric units 111 which are adjacent to each other. Furthermore, the stacked condition of the piezo-electric units 100 is such that the portions of the piezo-electric elements 111-1 subjected to axially asymmetrical deformation are aligned along the axial direction. In other words, between the piezo-electric elements 111-1 which are adjacent with each other, the electrodes 111ca, 111cb and 111cc are, respectively, arranged axially aligned.

Under a non-energized condition, the stack 110 of the piezo-electric units 111 is under a straight and shrunk condition. An occurrence of a difference in an electric voltage between one of the metal plate 111b and the electrodes 111ca, 111cb and 111cc in each of the units 110 causes the piezo-electric elements 111-1 to be asymmetrically displaced (outwardly convexed) at locations corresponding to the electrodes as energized. Such asymmetrical displacements of the piezo-electric elements between the units 111 are summed up due to the fact that the units 111 are connected with each other by means of the connecting elements 113 and that the electrodes 111ca, 111cb or 111cc, which are axially aligned between the units 111 in the stack 110, are energized. As a result, a bending movement of the stack 110 is obtained in a direction as shown by an arrow X or Y in FIG. 15B. Contrary to this, when the same voltage difference is applied between the metal base plates 111b and the all of the electrodes 111ca, 111cb and 111cc, all of the piezo-electric elements 111-1 between the stack 110 of the units 111 are axially symmetrically displaced or convexed, which are summed. As a result, an elongation of the stack 110 of the units 111 is obtained in the axial direction Z as shown in FIG. 15C.

Now, an operation of the articulation device 100 according to the present invention will be explained with reference the attached drawings. When a delicate manipulation is needed, a drive signal, the voltage of which is gradually changed, is applied to selected piezo-uni-morph elements, which causes the stack (bending movement generator) 110 to be slowly flexed as shown in FIG. 15B. The inertia body 130 (FIG. 10) at the end of the stack of the piezo-electric elements can follow to such a bonding movement, which occurs slowly, so that slow movement of the inertia body 130 is obtained in a direction as shown by an arrow in FIG. 16A, which is transverse to the axis Z of the stack 110 and which correspond to the direction X or Y in FIG. 15B. In other words, a fine movement of the inertia body 130, which is in a permissible range of a flexible movement of the stack 110 of the piezo-electric elements 111, is obtained.

When fine manipulation is needed in the axial direction Z, the stack 110 of the piezo-electric elements 111 is extended or contracted in an axial direction as shown in FIG. 15C. In this case, the linear movement of the stack 110 causes the inertia body 130 to be also moved in this direction. Such an elongated or contracted movement in the axial direction Z can also be done when a quick manipulation is needed.

It should be noted that a relative positional change between the moving member 121 and the supporting member 122 does not occur during such a fine manipulation at slow speed. Furthermore, a maximum length of the movement of the inertia body 130 is limited in the permissible range of the bending movement of the stack of the piezo-electric units 111. Namely, a fine movement of the inertia body 130 in the order of a micrometer or a nanometer can be obtained.

When it is required that the inertia body 130 can be moved much faster, i.e., when a rough movement, which exceeds the limit of the movement generated by the bending of the actuator 110, is needed, a single applied to the actuator 110 has, in one cycle a difference between a rising period $T_1$ and a falling period $T_2$, as shown in FIG. 3, with reference to the first embodiment. During the period where a voltage with a quickly changing value is applied to the stack 110 of the piezo-electric units, a bending movement of the stack from a rest condition, as shown in FIG. 17A, to a flexed condition, as shown in FIG. 17B, is obtained. Such a bending movement of the stack 110 occurs very rapidly, so that the inertia body 130 at the end of the stack 110 cannot instantly follow the rapid movement of the end of the stack 110 due to the inertia of the inertia body 130, which causes the body 130 to be likely stay at a location where the body 130 was initially located as shown in FIG. 17B. As a result, any substantial movement of the inertial body does not occur or the movement is very small, which causes a reaction force to be generated in the moving member 121, which urges the latter to be rotated. When this reaction force is larger than a frictional force between the outer surface of the moving member 121 and the inner surface of the housing 122, a sliding movement of the moving member 121 with respect to the housing 122 occurs, i.e., the moving member 121 is rotated in the housing 120. As a result, the piezo-electric stack 110 is flexed at its root portion where the stack 110 is connected to the connecting member as shown in FIG. 17B.

Then, in the second period $T_1$ in the cycle T of the operating signal as shown in FIG. 3, where the electric voltage applied to the stack 110 is slowly reduced, the stack is slowly returned to its straight condition. Due to the slow speed movement of the stack 110, the inertial body 130 can now follow the movement of the end of the stack 110, so that the moving member 121 is prevented from being rotated with respect to the holder 120. As a result, the inertia body 130 becomes located on the axis of the stack 110, as shown in FIG. 17C. Since the moving member 120 is at a location which is rotated with respect to the original position as shown in FIG. 17A, the line along which the stack 110 now extends is inclined with respect to the direction along which the stack 100 was originally oriented. In short, from the originally located position as shown in FIG. 17A, an amount of a movement is obtained in a direction x or y.

A repetition of the above mentioned step in FIGS. 17A to 17C causes movement by the bending of the stack 110 to be summed, or accumulated, thereby obtaining a movement of the inertia body 130, which is larger than a movement obtained by a single bending movement of the actuator 110. Thus, a rough movement to a desired position becomes possible.

Furthermore, a sequential energization of the stack 110 of the piezo-electric elements can be employed in the order of the electrodes 111ca, 111cb and 111cc. In this case, an oscillating movement of the stack 110 is obtained, thereby causing the inertia body 130 to be subjected to a rotating movement about an axis which is inwardly spaced from the axis of the inertia body 130.

In the above embodiment, in a cycle T of the operating signal in FIG. 3, the setting up in the first half period is done quickly, while the setting down in the second half period is down slowly, thereby obtaining a difference between the set up time and set down time. However, in place of such an operation, the set up can be done slowly, while the set down is done rapidly in order to obtain a similar effect.

Furthermore, it should be noted that the length of the movement of the inertia body 130 per one rough movement of the actuator depends on various factors, such as a distance between the end of the inertia body 130 and the articulation unit 120, a magnitude of the oscillation of the inertia body 130, a weight of the inertia body 130 and a frictional condition between the moving member 121 and the holder 122 in the articulation unit 120. Thus, these factors are suitably selected so that a desired length of the movement in a rough moving mode is obtained.

In this embodiment of the micro-manipulator provided with a working member (finger) 102 at the end of the inertia body, the working member 102 is subjected to a movement which is identical to that of the inertia body 130. Namely, during a slow bending movement of the actuator 110 (piezo electric element stack), a fine or micro movement of the working movement 102 is obtained. Contrary to this, during a rapid bending movement, a rough movement of the working member 102 is obtained, which is out of the range of the bending movement of the actuator 110.

In short, according to this embodiment, a precise positioning of the working member 100, such as a micro-needle or micro-cutter or micro-capillary is obtained with respect to the workpiece 107. Furthermore, in this embodiment, the bending movement generator is constructed as the stack of the piezo-electric elements, which allows the construction to be simplified and to be compact and the weight to be reduced. Furthermore, the electric circuit for operating the actuator 110 can also be simplified.

Fifth Embodiment

FIG. 18 shows another embodiment of a micro manipulator according to the present invention. The embodiment features, in order to obtain a bending movement, an actuator 110A of a conventional type of stack of piezo-electric elements, wherein a telescopic movement only can be done. The linear telescopic type actuator 110A is constructed by a stack of plate-shaped piezo-electric elements, each having, on both sides, electrodes for applying electric voltage, although not shown in detail. The application of the electric voltage causes the piezo-electric elements to be elongated in a direction of the thickness of the elements. As shown in FIG. 18, three of such actuators 110 are employed so that they are spaced at an angle of 120 degree to each other, thereby constructing a bending movement generator in this embodiment. As shown in FIG. 18, the actuators 110A extend in parallel to each other from the flange member 121c transverse to the plane of the flange 121c. Each actuator 110A has, at its end remote from the flange member 121c, hinge members 141, which are articulated to the plate shaped lever member 142 by means of socket portions 142-1 located on position of the member 142 spaced from its central axis. As a result of this arrangement, a relative inclined movement of the plate shaped lever member 142 is allowed with respect, to the actuators 110A. A stretched spring 143 is arranged along the central axis and has a first end connected to the the flange member 121c and a second end connected to the lever member 142. As a result, a preset load, which corresponds to the stretching force of the spring, is generated in the actuators 110A.

The inertia body 130 is connected to the lever member 142. As a result, the bending movement generators constructed by the three actuators 110A, the inertial body 130 and the articulation section 120 cooperate with each other to construct a manipulator.

Figure 19A:
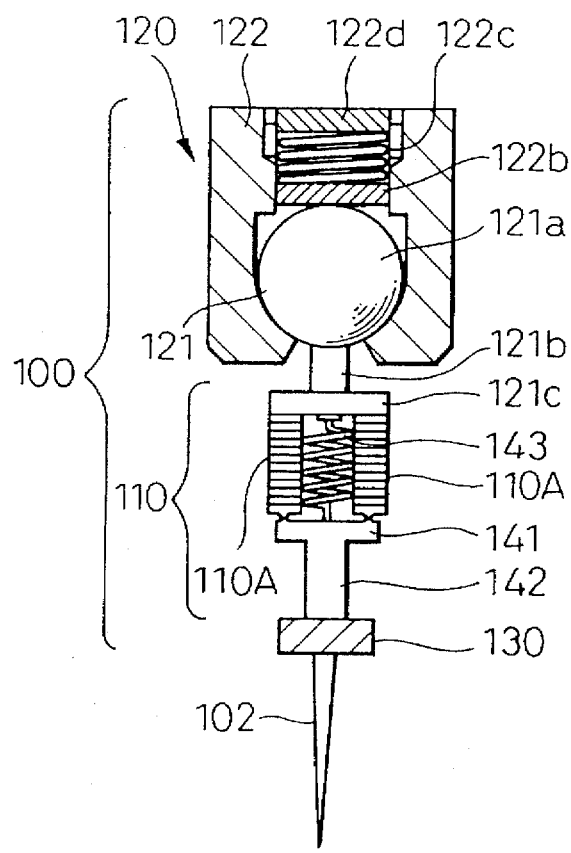
FIG. 19A shows a side view of the articulation device in the fifth embodiment but shows an actuator when it is in a de-energized condition.
Figure 19B:
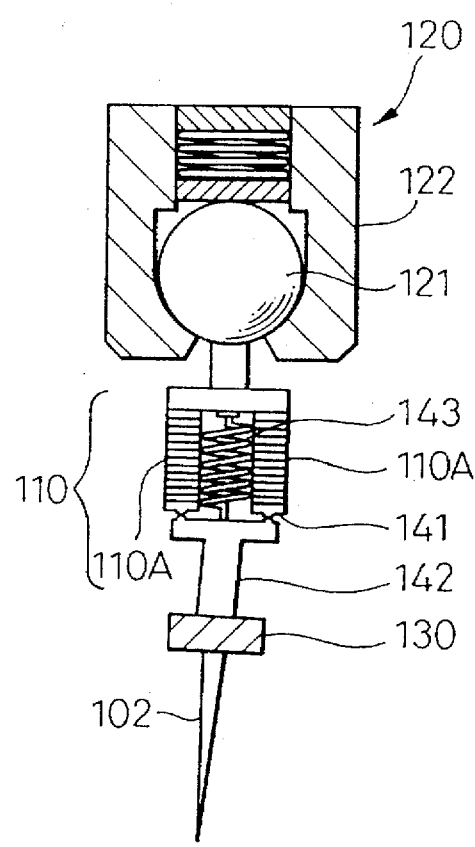
FIG. 19B shows a side view of the articulation device in the fifth embodiment but shows the actuator when it is subjected to a bending movement in the fine movement mode.

In the operation of the articulation device 100 according to this embodiment, among the three actuators 110A, one or two of the actuators 110A is or are supplied with an electric voltage signal, which causes the latter to be elongated, while remaining actuators or actuator is or are not elongated. In other words, among three locations spaced from the central axis, one or two locations is or are subjected to the force generated at the actuator or actuators as energized. As a result of such a localized distribution of the extending force, an inclination of the lever member 42 is generated. Namely, the inertia body 130 is moved from a straight position as shown in FIG. 19A to an inclined position as shown in FIG. 19D in the direction x or y.

Since the amount of the elongation or contraction of the piezo-electric actuators 110A is usually about a few 10s of mm, even the use of an amplification means comprising the hinge members 141 and the plate shaped lever 142 causes an amount of the movement of the inertial body 130 to be at most about a few 100s of mm. Thus, a controlled or slow application of the electric voltage to the actuators 110A allows a micro-manipulation to be carried out.

Furthermore, when the triangle wave signal as shown in FIG. 3 is applied to one or two of the actuators 110A (a stack or stacks of the piezo-electric elements), a rapid increase in the voltage level during the period $T_1$ causes the actuator(s) 110A to be abruptly elongated. The inertia body 130 is likely to maintain its own position, i.e., the position of the lever 142 due to the large inertia of the inertia body 130, so that a reaction force is generated in the moving body 121 in the holder member 122 and overcomes the frictional force between the parts 121 and 122, which allows the spherical 121a to be rotated from a position as shown in FIG. 20A to a position as shown in FIG. 20B.

A gradual reduction of the voltage level during the second half period $T_2$ of the driving signal in FIG. 3 allows the actuator(s) 110A to be contracted, while allowing the inertia body 130 as well as the working tool 102 to follow the movement of the end(s) of the actuator(s) 110A as shown in FIG. 20C. In other words, the moving member 121 is prevented from being moved in the holder 122, while the inertia body 130 as well as the working tool 102 can be located along the axis of the articulation device 100. In short, a rough or large movement of the inertia body from the neutral position in the x or y direction is obtained.

The application of the triangle shaped signal in FIG. 3 causes a repetition of above-mentioned rapid and slow movements to occur, which allows the inertia body to be moved beyond the amount of the bending movement of the actuator 110A and to be roughly moved to a desired target position.

In this embodiment, a sequential application of the electric signal to the three actuators 110A in the circumferential order causes the articulation device 100, i.e., the inertia body 130 to be subjected to an oscillating movement.

Furthermore, a simultaneous application of the voltage signal to all of the three actuators 110A causes the latter to be simultaneously elongated, thereby causing the inertia body 130 to be axially moved.

In short, the a micro-manipulator provided with the finger 102 at the end of the bending movement manipulator 110 allows the finger 102 to be selectively subjected to a fine movement or a rough movement.

In the above explained fifth embodiment, in order to obtain a bending movement in X or Y direction as well as an elongating movement in Z direction, three piezo-electric actuators 110A are used. However, when only one bending movement in X or Y direction is required, a single piezo-electric actuator is sufficient. Furthermore, when a bending movement in an X or Y direction and an elongating movement in the Z direction are needed, two piezo-electric actuators are sufficient. However, in the latter case, a piezo-electric actuator, which effects only the axial elongation, is necessary, while the other actuator is located as at a position spaced from the central axis, which allows the plate shaped lever 142 to be inclined.

In the fifth embodiment, the bending movement generator 110 of the articulation device 100 can be constructed from the stacked type actuator as explained with reference to the fourth embodiment. Namely, in this case, the actuator is, as in FIGS. 11 and 12, constructed by a stack of the piezoelectric units 111, each constructed by a piezo-uni-morph or piezo-bi-morph elements. However, unlike to the fourth embodiment, each of the actuators 110A in the fifth embodiment in FIG. 18 is subjected only to the axial elongating movement, i.e., any bending movement is not necessary for each of the actuators. Thus, the angularly divided construction of the electrodes as explained with reference to FIGS. 13A and 13B is unnecessary. In other words, only one electrode would be arranged on a side surface of a piezo-electric element.

Finally, in this fifth embodiment, the function of the plate shaped lever can be incorporated in the inertia body 130.

Sixth Embodiment

FIG. 21 shows a sixth embodiment of the present invention. This embodiment features a first and a second articulation devices 200 and 300 which are connected to series with each other. Namely, the first stage articulation device 200 has the same structure as that in the fourth embodiment in FIG. 10. In other words, the first stage articulation device 200 has a construction similar to that of the articulation device 100 in the fourth embodiment, and is constructed by a bending movement generator constructed by an actuator 110 as a stack of piezo-electric elements 111, an articulation unit 120 and an inertia body 130. The second stage articulation device 300 is constructed by a bending movement generator constructed by an actuator 110 as a stack of piezo-electric elements 111 and an articulation unit 120. The bending movement generator of the second stage articulation device 300 is connected to the articulation unit 120 of the first stage articulation device 200.

In the construction of the sixth embodiment, each of the articulation devices 200 and 300 can effect both of the fine movement by the bending movement and the rough movement by the rotation. As a result, a highly increased amount of the movement of the inertia body 130 at the bottom end can be obtained compared to the construction where only one articulation device is provided. As a result, the finger member 102 at the inertia body 130 can obtain a wide range of the movement, thereby obtaining a precise positioning.

In the construction in FIG. 21, the first stage articulation device 200 has an inertia body of the second stage articulation device 300. In other words, the provision of a separate inertia body is eliminated. However, a separate inertia body can also be provided to the second stage articulation device 300.

Furthermore, in the construction in FIG. 21, a rotating movement as well as a bending movement are possible for each of the articulation devices 200 and 300. Thus, it is possible that the first stage articulation device 200 is formed as a finger while the second stage articulation device 300 is formed as a wrist mechanism.

Seventh Embodiment

Figure 22:
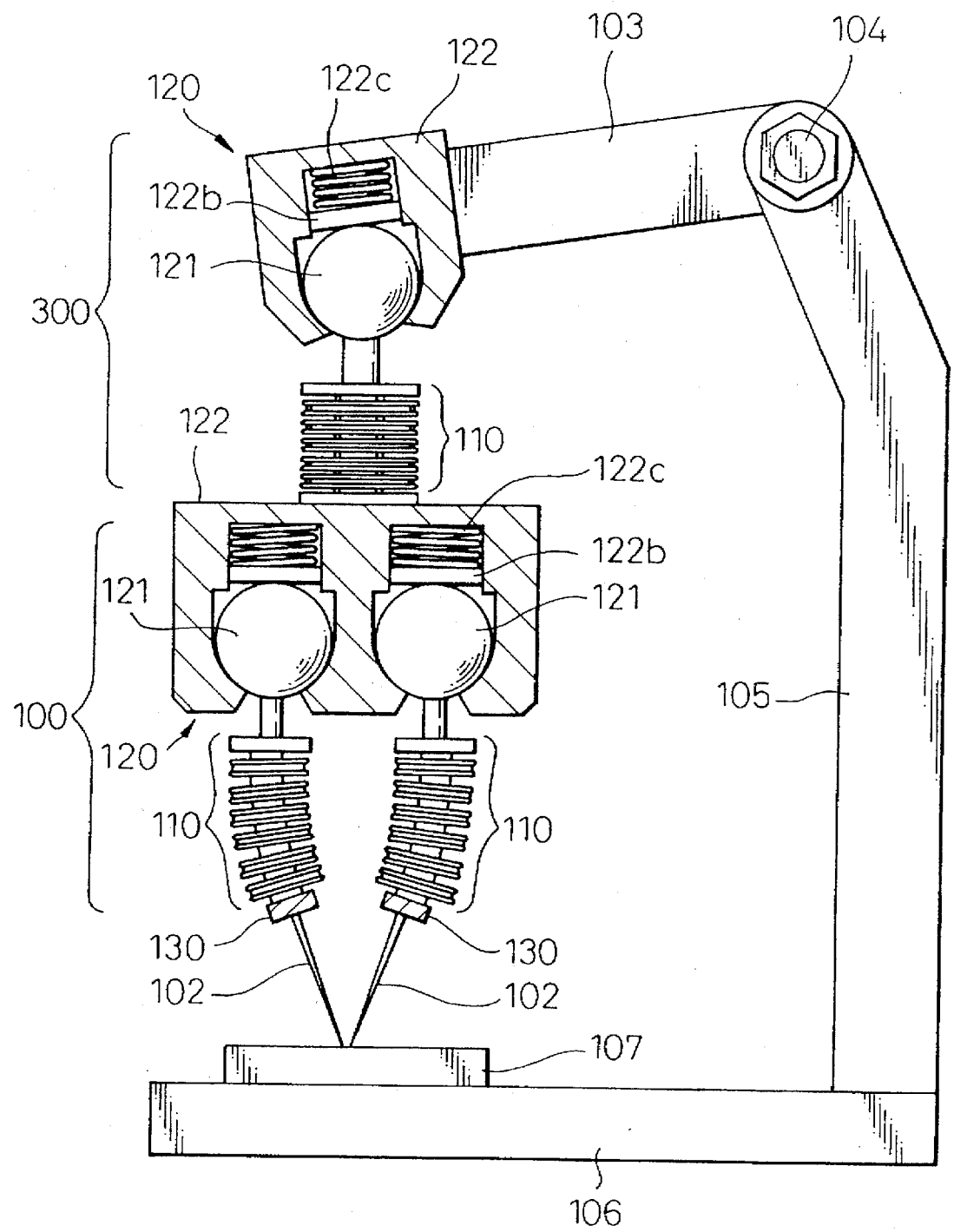
FIG. 22 is a side view of a manipulator in a seventh embodiment of the present invention.

FIG. 22 shows a micro-manipulator of the seventh embodiment. This embodiment features a provision of articulation devices, which are, in part, arranged in parallel and which are, also, in part, arranged in series. Namely, the articulation device includes a pair of actuators 110 as a stack of the piezo-electric elements, which are arranged in parallel, which are connected to an articulation section 120 having a holder 122 and a pair of moving members 121 connected to the actuators 110, which are in parallel. Each of the actuators 110 is connected to a corresponding inertia body 130 and a corresponding finger 102. In other words, in this embodiment, the holder 122 is common to both of the actuators 110, which are in parallel.

In the seventh embodiment, the wrist articulation mechanism 300 is construed as an articulation mechanism which is constructed as a bending movement generator constructed by a stack typed actuator 110, as similar to the embodiment. This construction allows that both a fine and a rough movement is obtained and a rotating and a bending movement is possible. Furthermore, for each of the fingers 102, due to the provision of the bending movement generator constructed by the stack of the actuator 110, both the fine and the rough movement as well as a rotating and a turning movement are possible.

In short, according to the manipulator in the seventh embodiment, the movement of the wrist articulation mechanism 300 and the fingers 102 are cooperate, so that a fine movement and a rough movement are obtained, which allows a small working piece 107 to be worked. In other words, the mechanism can be used as a micro-hand mechanism.

Eighth Embodiment

Figure 23:
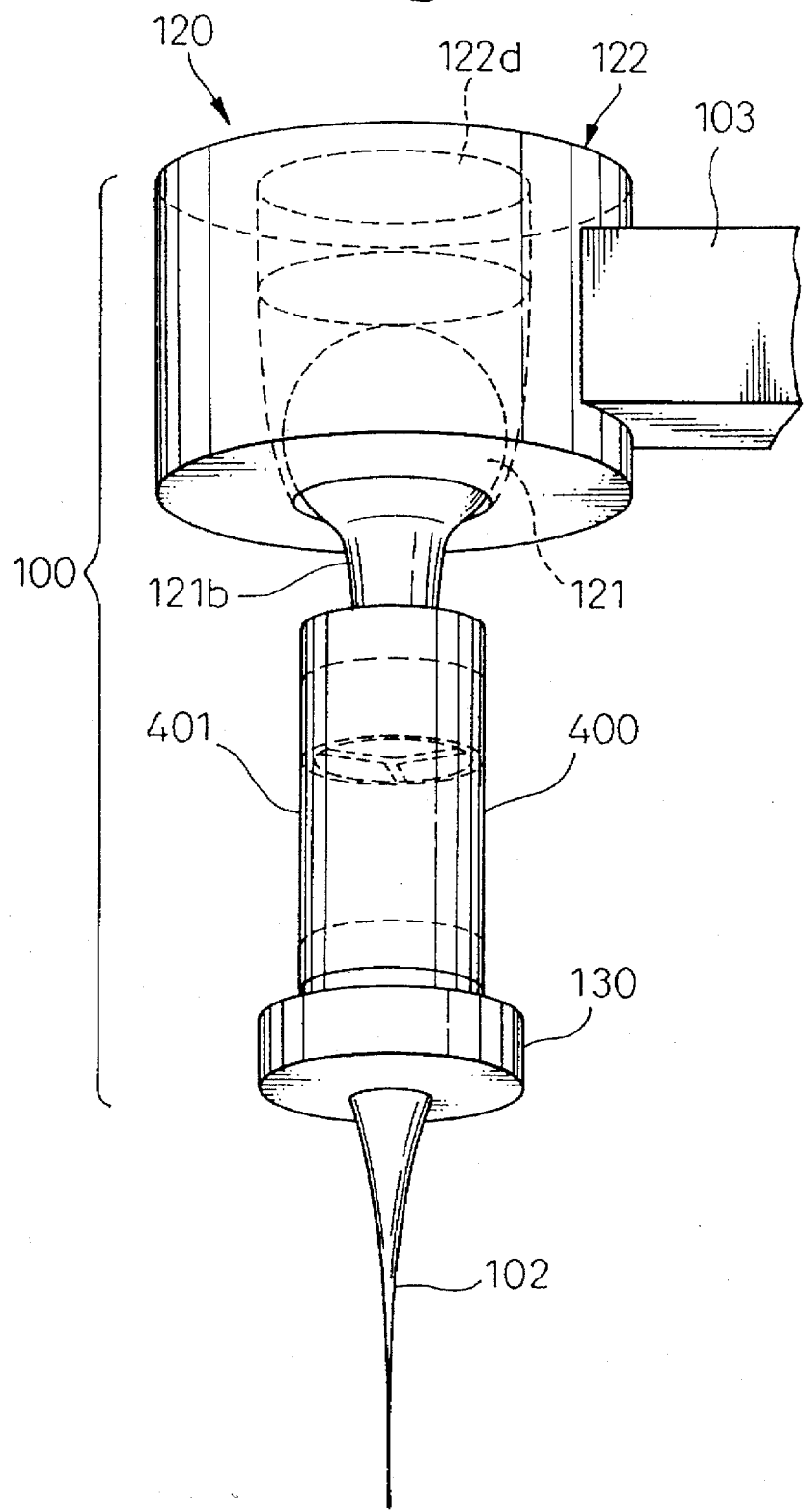
FIG. 23 is a schematic perspective view of a manipulator in a eighth embodiment of the present invention.
Figure 24:
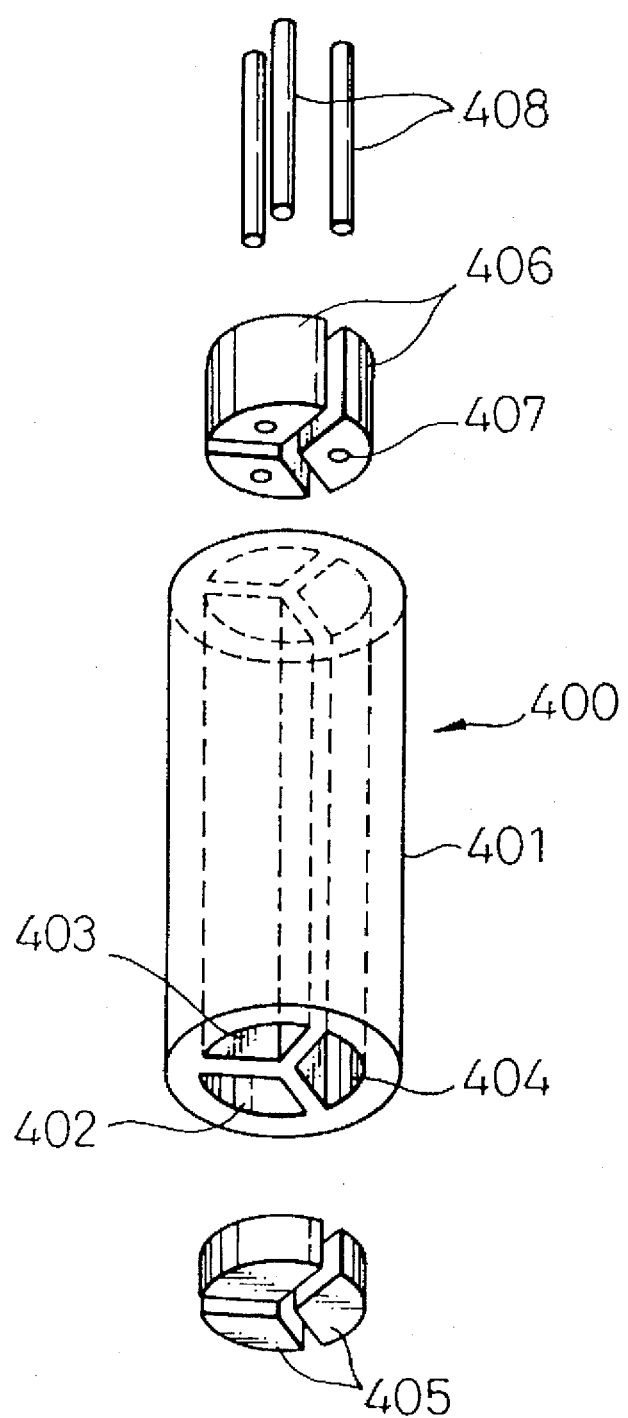
FIG. 24 is a dismantled perspective view of a fluid type actuator in the manipulator in FIG. 23.

FIGS. 23 and 24 show a micro-manipulator of the eighth embodiment. Unlike to the first to seventh embodiments, where a bending movement generator is constructed by the actuator 110 or 110A as the stack of piezo-electric elements, the bending movement generator in the eighth embodiment is constructed by a flexible actuator 400, wherein a bending movement is generated by an application of a pressure of a gas or liquid. The flexible actuator 400 includes a flexible tube 401 made of a material such as a silicone rubber. In a well known manner, a metal wire of a helical shape, which is not shown, is arranged inside the tube 401, so that an axial expansion of the tube 401 is obtained, while limiting a radial expansion of the tube. A space inside the flexible tube 401 is divided into a plurality of, for example, three chambers 402, 403 and 404. End caps 405 and 406 are provided at the ends of the tube 401, respectively. The end caps 406 at the end adjacent the base 103 are formed with communication holes 407, to which flexible hoses 408 are connected. These flexible hoses 408 are connected to pressure control valves (not shown). These pressure control valves are selectively controlled for controlling an introduction of the gas or liquid pressure via the flexible hoses 408. A resultant pressure increase at one or two of the chambers 402, 403 and 404 causes the corresponding chamber or chambers to be axially elongated, so that a bending movement of the flexible tube 401 is obtained toward the chamber or chambers which are not subjected to the axial elongation.

In the eighth embodiment, as shown in FIG. 23, at the free end of the flexible actuator 400, an inertia body 130 as a finger 102 are connected, while at the bottom end of the actuator 400, the articulation unit 120 is connected. As a result, similar to any of the previous embodiments, a micro movement as well as a rough movement can be selectively obtained. Namely, a gradual change of the pressure applied to the actuator 400 causes the latter to be slowly bent, thereby obtaining a fine movement of the finger 102 (working member). Contrary, a rapid change of the pressure causes the flexible actuator 400 to be subjected to a rough movement due to the operation of the articulation unit 120, thereby obtaining an increased range of the movement of the finger 102.

We claim:

1. An articulation device comprising:

an inertia body;

a stationary holder member defining a contacting surface of a predetermined profile;

a moving member which is rotatable with respect to the holder member and which is in a frictional contact with said contacting surface of the stationary member, so that the moving member is slidably rotatable with respect to the holder member;

means for supporting the inertia body with respect to the moving member while allowing a relative movement to occur between the inertia body and moving member, and;

actuator means arranged between the moving member and the inertia body for generating said relative movement for causing the holder member and the moving member to be relatively rotated when a reaction force generated in the moving member by the inertia of the inertia body overcomes said frictional force.

2. An articulation device according to claim 1, wherein the supporting means and the actuator means are arranged separately between the moving member and the inertia body.

3. An articulation device according to claim 1, wherein the supporting means and the actuator means are arranged integrally between the moving member and the inertia body.

4. An articulation device according to claim 1, wherein said actuator comprises a stack of piezo-electric elements.

5. An articulation device comprising:

an inertia body;

a stationary holder member defining a contacting surface of a predetermined curve;

a moving member which is rotatable with respect to the holder member and which is in a frictional contact with the contacting surface of the stationary member, so that the moving member is slidably rotatable with respect to the holder member;

means for supporting the inertia body with respect to the moving member while allowing a relative movement to occur between the inertia body and moving member, and;

actuator means arranged between the moving member and the inertia body for generating the relative movement;

said actuator means generating said relative movement between the inertia body and moving member in one direction and such that a reaction force generated in the moving member by an inertia of the inertia body exceeds said frictional force between the moving member and the contacting surface of the stationary member;

said actuator means generating said relative movement between the inertia body and moving member in the opposite direction such that a reaction force generated in the moving member by an inertia of the inertia body does not exceed said frictional force.

6. An articulation device comprising;

an inertia body;

a stationary holder member defining a contacting surface of a predetermined curve;

a moving member which is rotatable with respect to the holder member and which is in a frictional contact with the contacting member of the stationary member, so that the moving member is slidably rotatable with respect to the holder member, and;

actuator means arranged between the moving member and the inertia body for supporting the inertia body with respect to the moving member while generating a relative movement between the inertia body and moving member;

said actuator means generating said relative movement between the inertia body and moving member in one direction such that a reaction force generated in the moving member by an inertia of the inertia body exceeds said frictional force between the moving member and the contacting surface of the stationary member;

said actuator means generating said relative movement between the inertia body and moving member in the opposite direction such that a reaction force generated in the moving member by an inertia of the inertia body does not exceed said frictional force.

7. A device according to claim 6, wherein said holder member forms a partially opened spherical shape, the moving member forms a plate extending transverse to the axis of the device and having an outer periphery in contact with the contacting surface of the holder member, and the angular displacement generating means comprise a plurality of angularly spaced generator means arranged on the plane along the circumferential direction, the angularly spaced generator means being selectively operated so that a localized displacement of the moving member is generated transverse to the plane, thereby obtaining a relative rotating movement between the moving member and the holder member.

8. An articulation device according to claim 6, wherein said actuator means comprise a flexible support member having a first end connected to the moving member and a second end defining a transversely projected portion, the actuator means being arranged between the projected portion and the moving member so as to obtain selective axial elongation and contraction, thereby causing the inertia body and the moving member to be relatively rotated.

9. A device according to claim 8, wherein said actuator means comprises a stack of piezo-electric units, which is subjected to said axial elongation or contraction by an application of an electric voltage.

10. A device according to claim 6, wherein the actuator means is arranged to act on the moving member so that an elongation or contraction of the generating means cause an inclination of the moving member to be occurred with respect to the axis of the device.

11. A device according to claim 10, wherein said actuator means comprise a piezo-electric actuator, an application of an electric voltage causing the generator to be subjected to an elongation or contraction, thereby obtaining the relative movement.

12. A device according to claim 11, wherein said piezo-electric type angular displacement generating means comprise a piezo-electric member of a plate shape, and at least one electrode plate on a side of the piezo-electric member, an application of the electric voltage causing the piezo-electric member to be deformed.

13. An articulation device comprising;
an inertia body;
a stationary holder member defining a contacting surface of a predetermined curve;
a moving member which is rotatable with respect to the holder member and which is in a frictional contact with the contacting member of the stationary member, so that the moving member is slidably rotatable with respect to the holder member;

said moving member being formed by a resilient material and forming, on its one side faced the inertia body, a surface extending transversely to an axial direction of the articulation device, and;

actuator means arranged between the moving member and the inertia body for supporting the inertia body with respect to the moving member while generating a relative movement between the inertia body and moving member;

said actuator means comprise a plurality of circumferentially spaced actuating sections for generating a localized movement between the inertia body and portions of the supporting member along plurality of planes transverse to said surface of the moving member;

the circumferentially adjacent actuating sections being operated such that a fixed amount of local displacement consecutively occurs between the adjacent actuating sections in one circumferential direction so that a reaction force generated in the moving member by an inertia of the inertia body exceeds said frictional force between the moving member and the contacting surface of the stationary member;

the circumferentially adjacent actuating sections being operated such that a fixed amount of local displacement consecutively occurs between the adjacent actuating sections in the opposite circumferential direction so that a reaction force generated in the moving member by an inertia of the inertia body does not exceed said frictional force between the moving member and the contacting surface of the stationary member.

14. An articulation device comprising:
a stationary holder member defining a contacting surface of a predetermined curve;
a moving member which is rotatable with respect to the holder member and which is in contact with the stationary member while providing a predetermined frictional force between the stational member and the moving member, so that the moving member is slidably rotatable with respect to the holder member;
an inertia body which is connected with the moving member while allowing a relative movement to occur between the inertia body and moving member, and;
a bending movement generator arranged between the moving member and the inertia body for generating a relative movement between the holder member and the moving member;
said relative movement being such that a gradual bending movement of the bending movement generator causes the inertia body to be subjected to a fine movement, and a rapid bending movement of the bending movement generator causes an inertia reaction force to be generated in the moving member due to the inertia of the inertia body, thereby causing the moving member to be slidably moved with respect to the contacting surface of the holder member against said frictional force, causing the inertia body to be subjected to a rough movement.

15. An articulation device according to claim 14, wherein said bending movement generator is of a type capable of obtaining both a bending movement and an elongation movement which are desirably selected.

16. An articulation device according to claim 14, wherein said bending movement generator comprises an actuator as a stack of piezo-electric elements having divided type electrode for generating axially asymmetric deformation.

17. An articulation device according to claim 14, wherein said bending movement generator comprises a flexible type actuator having a plurality of chambers to which a pressurized fluid is selectively introduced, so that a desired bending movement is obtained.

18. An articulation device according to claim 14, wherein said bending movement generator comprises at least one actuator constructed as a stack of piezo-electric elements, which actuator is subjected to an elongation when a voltage signal is applied thereto, and a lever mechanism for transforming the elongation movement to a bending movement, said actuator being in an offset arrangement with respect to a central axis of the apparatus.

19. An articulation device according to claim 14, further comprising brake means for controlling the frictional force between the moving member and the holder member.

20. An articulation device according to claim 14, wherein said bending movement generator comprises a plurality of the actuators which are connected with each other.

21. An articulation device according to claim 20, wherein said plurality of the actuators are connected in parallel with each other.

22. An articulation device according to claim 20, wherein said plurality of the actuators are connected in series with each other.

23. A micro-manipulator comprising:

a finger for working a workpiece and;

an articulation device;

said articulation device comprising:

a stationary holder member defining a contacting surface of a predetermined curve;

a moving member which is rotatable with respect to the holder member and which is contact with the stationary member while providing a predetermined frictional force between the stational member and the moving member, so that the moving member is slidably rotatable with respect to the holder member;

an inertia body which is connected to the moving member while allowing a relative movement to be occurred between the inertia body and moving member, and;

a bending movement generator arranged between the moving member and the inertia body for generating a relative movement between the holder member and the moving member;

said relative movement being such that a gradual bending movement of the bending movement generator causes the inertia body to be subjected to a fine movement, and a rapid bending movement of the bending movement generator causes an inertia reaction force to be generated in the moving member due to the inertia of the inertia body, thereby causing the moving member to be slidably moved with respect to the contacting surface of the holder member against said frictional force, causing the inertia body to be subjected to a rough movement.

24. A micro-manipulator according to claim 23, further comprising a wrist mechanism arranged between a base of the manipulator and the articulation device, said wrist mechanism comprising:

a stationary holder member defining a contacting surface of a predetermined curve;

a moving member which is rotatable with respect to the holder member and which is contact with the stationary member while providing a predetermined frictional force between the stationary member and the moving member, so that the moving member is slidably rotatable with respect to the holder member;

inertia body which is connection with the moving member while allowing a relative movement to occur between the inertia body and moving member, and;

a bending movement generator arranged between the moving member and the inertia body for generating a relative movement between the holder member and the moving member;

said relative movement being such that a gradual bending movement of the bending movement generator causes the inertia body to be subjected to a fine movement, and a rapid bending movement of the bending movement generator causes an inertia reaction force to be generated in the moving member due to the inertia of the inertia body, thereby causing the moving member to be slidably moved with respect to the contacting surface of the holder member against said frictional force, causing the inertia body to be subjected to a rough movement;

said bending movement generator being connected to the moving member of the articulation device.

* * * * *